US012689383B2

(12) United States Patent
Kiesel

(10) Patent No.:  US 12,689,383 B2
(45) Date of Patent:        Jul. 21, 2026

(54) SYSTEM AND METHOD FOR SAMPLING SIGNALS

(71) Applicant: Viasat Inc., Carlsbad, CA (US)

(72) Inventor: Gregory N. Kiesel, Marietta, GA (US)

(73) Assignee: Viasat, Inc., Carlsbad, CA (US)

( * ) Notice: Subject to any disclaimer, the term of this patent is extended or adjusted under 35 U.S.C. 154(b) by 304 days.

(21) Appl. No.: 18/284,803

(22) PCT Filed: Mar. 29, 2022

(86) PCT No.: PCT/US2022/022406
§ 371 (c)(1),
(2) Date: Sep. 28, 2023

(87) PCT Pub. No.: WO2022/212418
PCT Pub. Date: Oct. 6, 2022

(65) Prior Publication Data
US 2024/0178850 A1      May 30, 2024

Related U.S. Application Data

(60) Provisional application No. 63/168,236, filed on Mar. 30, 2021.

(51) Int. Cl.
| | |
|---|---|
| *H03M 1/00* | (2006.01) |
| *H04B 17/345* | (2015.01) |
| *H04L 25/03* | (2006.01) |
| *H04L 27/06* | (2006.01) |

(52) U.S. Cl.
CPC .......... *H03M 1/007* (2013.01); *H04B 17/345* (2015.01); *H03M 1/002* (2013.01); *H04L 25/03038* (2013.01); *H04L 27/06* (2013.01)

(58) Field of Classification Search
CPC .... H03M 1/007; H03M 1/002; H04B 17/345; H04L 27/06; H04L 25/03038
See application file for complete search history.

(56) References Cited

U.S. PATENT DOCUMENTS

| | | | |
|---|---|---|---|
| 5,111,202 A | 5/1992 | Rivera et al. | |
| 6,538,592 B1 | 3/2003 | Yang et al. | |
| 10,439,626 B2 | 10/2019 | Lassen | |
| 10,897,387 B1 | 1/2021 | Bonen | |
| 2006/0079191 A1 | 4/2006 | Parssinen et al. | |
| 2009/0154612 A1* | 6/2009 | Rofougaran | ....... H03H 21/0001 375/344 |
| 2014/0233679 A1 | 8/2014 | Rajagopal et al. | |
| 2018/0167076 A1* | 6/2018 | Hossain | .................. H04L 25/03 |

FOREIGN PATENT DOCUMENTS

| | | |
|---|---|---|
| WO | 20090034618 | 12/2010 |

OTHER PUBLICATIONS

International Search Report and Written Opinion of PCT/US2022/022406 dated Aug. 3, 2022, 11 pages.

* cited by examiner

*Primary Examiner* — Joseph J Lauture
(74) *Attorney, Agent, or Firm* — Holland & Hart LLP

(57) ABSTRACT

A first analog signal may be sampled during a first time period in accordance with a first sampling range and a sampling resolution step size, where a first digital sequence may be outputted during the first time period based on sampling the first analog signal.

31 Claims, 10 Drawing Sheets

200

200

Signal Converter
315-a

Input Signal
303-A 315-b

303-B

Signal Converter
415-a 415-b

Beamformer
520

600

605 — Configure Signal Converter

610 — Configure Beamformer

615 — Generate Analog Signals Based On Detected RF Signal

620 — Amplify Analog Signals

625 — Determine Metrics For Analog Signals

630 — Reconfigure Signal Converter?     N

Y

635 — Reconfigure Signal Converter

640 — Reconfigure Beamformer

645 — Convert Analog Signals To Digital Signals

650 — Generate Beam Signals 800-a 800-b

900

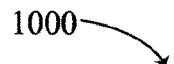

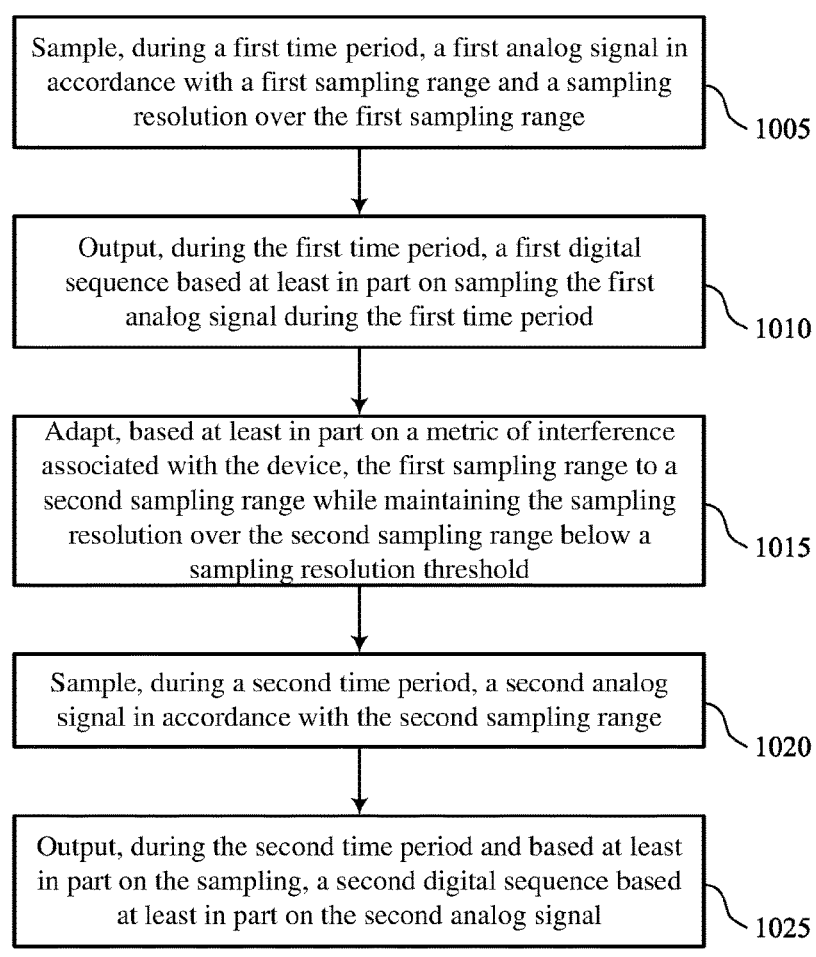

1000

Sample, during a first time period, a first analog signal in accordance with a first sampling range and a sampling resolution over the first sampling range

1005

Output, during the first time period, a first digital sequence based at least in part on sampling the first analog signal during the first time period

1010

Adapt, based at least in part on a metric of interference associated with the device, the first sampling range to a second sampling range while maintaining the sampling resolution over the second sampling range below a sampling resolution threshold

1015

Sample, during a second time period, a second analog signal in accordance with the second sampling range

1020

Output, during the second time period and based at least in part on the sampling, a second digital sequence based at least in part on the second analog signal

SYSTEM AND METHOD FOR SAMPLING SIGNALS

CROSS REFERENCE

The present application for patent is a 371 national phase filing of International Patent Application No. PCT/US2022/022406 by KIESEL entitled "SYSTEM AND METHOD FOR SAMPLING SIGNALS" filed Mar. 29, 2022, which claims the benefit of U.S. Provisional Patent Application No. 63/168,236 by KIESEL entitled "SYSTEM AND METHOD FOR SAMPLING SIGNALS" filed Mar. 30, 2021, each of which are assigned to the assignee hereof, and expressly incorporated by reference in its entirety herein.

BACKGROUND

The following relates generally to electronic communications, including a signal converter with variable sampling range.

Communications devices may communicate with one another using wired connections, wireless (e.g., radio frequency (RF)) connections, or both. A communications device may use a receiver to receive RF signals. The receiver may include a signal converter for converting analog signals output by one or more antennas to digital signals, which may include a stream of digital samples. A power consumption and digital sample throughput of a receiver may be based on a sampling range of the signal converter (which may also be referred to as a dynamic range) and a sampling resolution over the sampling range.

SUMMARY

A first analog signal may be sampled during a first time period in accordance with a first sampling range and a sampling resolution, where a first digital sequence may be output during the first time period based on sampling the first analog signal. Based on a metric of interference, the first sampling range may be adapted to a second sampling range while the sampling resolution may be maintained at a same level or a level that is below a threshold. During a second time period, a second analog signal may be sampled in accordance with the second sampling range, where a second digital sequence may be output based on sampling the second analog signal.

BRIEF DESCRIPTION OF THE DRAWINGS

FIG. 10 shows an example set of operations for a signal converter with variable sampling range in accordance with examples described herein.

DETAILED DESCRIPTION

Figure 1:
FIG. 1 shows an example of an environment that supports a signal converter with variable sampling range in accordance with examples described herein.
Figure 1:
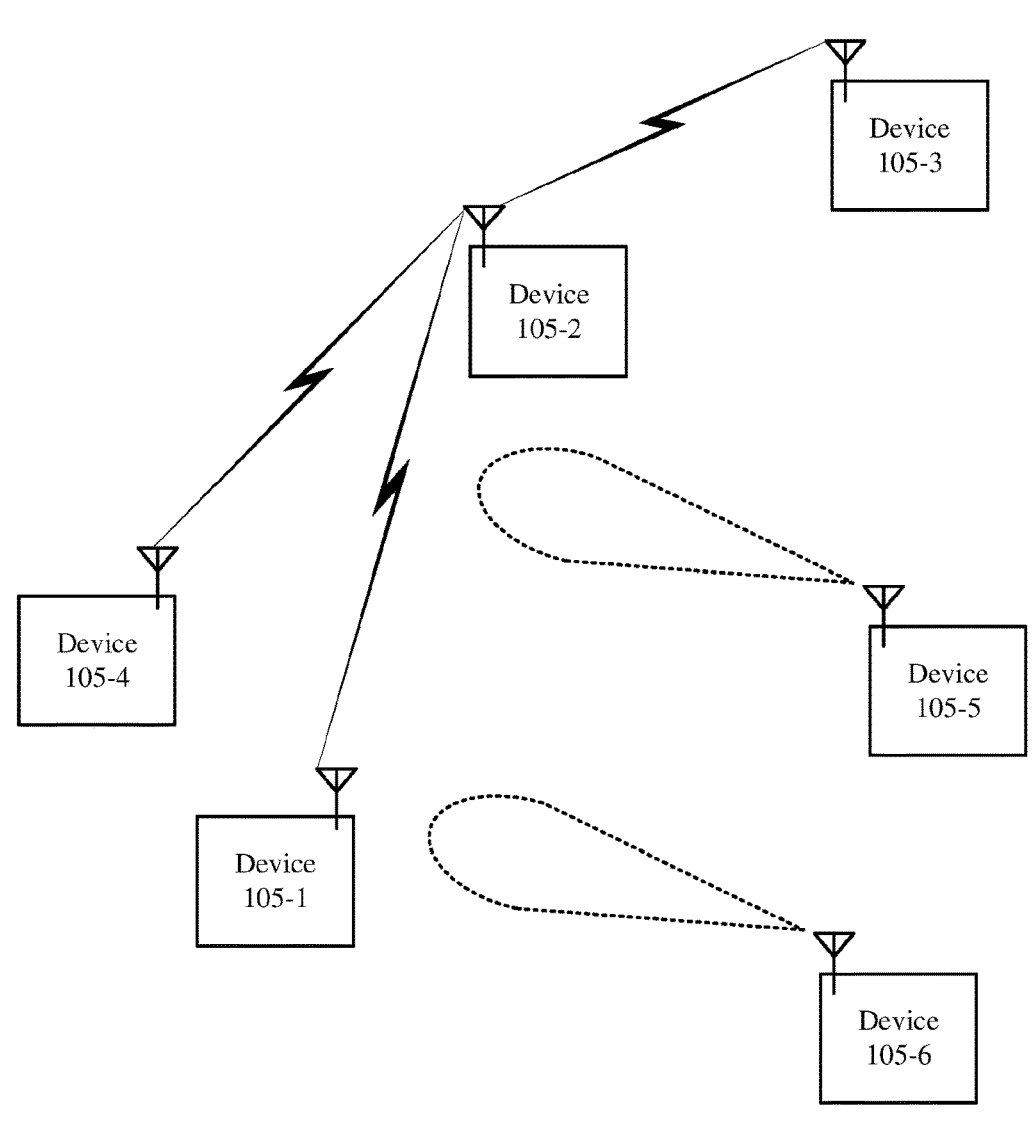

A receiver of a communications device may include a signal converter that is configured to convert an analog signal into a stream of digital samples. The signal converter may be configured to sample analog signals within a sampling range (which may also be referred to as the dynamic range of the receiver). The dynamic range may be bounded by a highest signal level and a lowest signal level. In some examples, the sampling range may be configured based on signaling extremes of a high-power wireless signal—e.g., so that the highest sampling level is greater than the highest expected signal level for the high-power wireless signal and the lowest sampling level is lower than the lowest expected signal level for the high-power wireless signal. Alternatively, some receivers may employ automatic gain control (AGC) to change the sampling range of such receivers so that respective sampling ranges can be dynamically configured to support larger and smaller signal levels—e.g., as a magnitude of a respective received signal changes.

The signal converter may further be configured to sample analog signals in accordance with a sampling resolution, where the sampling resolution may correspond to a difference between two detection levels of a signal converter (e.g., the difference between detection levels of 0V and 0.1 V). A quantity of signal levels distributed over the sampling range may be based on the sampling resolution. In some examples, the sampling resolution may be configured based on information derived from an analog signal. For example, the sampling resolution may be configured so that data-related variations in the information signal will be captured by the signal converter—that is, to ensure that data-related variations do not occur between two sample levels detectable by the signal converter. A bit width of the digital samples output by the signal converter may be based on the sampling range and the sampling resolution. In the example receivers employing AGC, a sampling resolution may change when a sampling range changes—e.g., a sampling resolution may decrease when a sampling range of the receiver changes. In such cases, increasing a sampling range of a receiver using AGC may cause data-related variations in the information signal to be missed.

A signal converter may be configured with a sampling range that is sufficient to capture large variations in a high-power (e.g., high peak-to-peak) wireless signal and that is also configured with a sampling resolution that is high enough to capture small variations in the wireless signal. As also suggested herein, a bit-width of samples output by such a receiver may be large (e.g., larger than a noise-sampling receiver) and, thus, a power consumption of the receiver may be high (e.g., higher than a noise-sampling receiver). In some examples, during operation, a receiver may only receive (e.g., intermittently, primarily, etc.) wireless signals having magnitudes that are significantly smaller than the high-power wireless signal, despite being configured for the high-power signal. In such cases, a signal converter having a smaller sampling range (e.g., a sampling range that is a half or a quarter of the sampling range of the signal converter configured for the high-power signal) and a similar sampling resolution may be sufficient to receive the significantly smaller signals. Accordingly, during these periods of operation, the signal converter with an excessive dynamic range may consume excessive power and output samples with excessive bit-widths based on being configured for the high-power wireless signals. That is, the signal converter may consume the energy for receiving high-power wireless signals even though the lower power wireless signals could be processed with less energy.

To enable a receiver to process high-power wireless signals and to conserve power when processing lower power wireless signals, the receiver may be configured with a signal converter that is capable of changing its sampling range while maintaining a same sampling resolution, maintaining the sampling resolution at or below a sampling resolution threshold, or configuring a finer sampling resolution. In some examples, the sampling range of the signal converter may be adaptable by enabling and disabling one or more elements (e.g., sets of comparators) in the signal converter such that the sampling resolution is maintained at or below a sampling resolution threshold. In some examples, the sampling range of the signal converter may be adaptable, and the sampling resolution of the signal converter may be maintained at or below a sampling resolution threshold by increasing or decreasing a quantity of approximation cycles applied to each analog sample. In some examples, a combination of these effects may be employed. Based on adapting the sampling range of the signal converter while maintaining the sampling resolution at or below a sampling resolution threshold, a bit-width of samples output by the signal converter may change.

FIG. 1 illustrates an example of an environment 100 that supports a signal converter with a variable sampling range in accordance with examples as disclosed herein.

One or more devices (e.g., including devices 105) may be present within the environment 100. The devices (e.g., first device 105-1 through sixth device 105-6) may be capable of transmitting and receiving wireless signals at radio frequencies (which may also be referred to as RF signals). The devices may include one or more antennas to support the transmission and reception of wireless signals. The devices may be (or include) personal electronic devices, such as mobile devices (e.g., phones, radios, laptops, tablets, personal digital assistants, electronic readers, etc.) and other less mobile devices (e.g., desktops, televisions, servers, etc.). In some examples, the mobile devices and/or other devices may be included in mobile vehicles (e.g., automobiles, nautical vessels, airplanes, satellites, etc.)—thus, otherwise stationary devices (e.g., the less mobile devices) may become mobile devices.

The devices may support device-to-device (D2D) communications (e.g., using Bluetooth or other D2D protocols). Additionally, or alternatively, the devices may use one or more access networks to facilitate communications with other devices. For example, the devices may use a cellular access network, a local access network (e.g., using Wi-Fi), or a satellite access network to communicate with other devices. In some examples, one or more of the devices are a part of an access network—e.g., second device 105-2 may be a satellite in a satellite access network. In such cases, second device 105-2 may relay signals between first device 105-1 and third device 105-3—in some examples, third device 105-3 may be (or be a part of) a ground station in a satellite access network. In another example, second device 105-2 may be a cell tower and may relay signals between first device 105-1 and third device 105-3—in some examples, third device 105-3 may be a user device or a server of a data network, among other options. Fourth device 105-4 may also communicate with second device 105-2—e.g., in some examples, fourth device 105-4 may have a subscription to a same access network as first device 105-1.

To communicate wirelessly, a device (e.g., any of the devices 105) may include circuitry for generating and transmitting wireless signals to other devices. The device may also include circuitry for receiving, and processing wireless signals emitted by other sources. The circuitry for transmitting wireless signals may be referred to as a transmit chain, and the circuitry for receiving wireless signals may be referred to as a receive chain.

The receive chain may include one or more antennas. In some examples, the receive chain may include an antenna array that includes multiple antennas—e.g., that are evenly spaced apart from one another. By using multiple antennas, the device may be capable of obtaining multiple signals from a wireless signal received at the antennas—e.g., if the wireless signal includes wireless signals communicated via different spatial paths. To receive the multiple signals, the device may use processing techniques to separate the wireless signals embedded within the received wireless signal.

The receive chain may also include one or more amplifiers (e.g., low-noise amplifiers), signal converters, and/or beamformers (e.g., digital beamformers), among other components. A signal converter may be configured to convert one or more analog signals (e.g., output by the one or more antennas) to one or more digital signals. The one or more digital signals may include streams of digital samples that can be stored or immediately processed by the device—e.g., the digital sequences may be stored in a buffer or memory or processed by a filter, beamformer, etc. The digital sequences may include a set of samples taken of the analog signal using the signal converter (e.g., in accordance with a periodic sampling interval). In some examples, the signal converter includes one or more analog-to-digital converters (ADCs).

In some examples, the signal converter may be configured to support noise sampling techniques. Noise sampling techniques may be used when a magnitude of the wireless signal (e.g., received at first device 105-1) is below, at, or near the noise floor. In such cases, an information signal may be included (e.g., hidden) in the wireless signal. In such cases, the signal converter may be configured to capture samples of the wireless signals using spread spectrum techniques, such as consistently dithering the boundaries of the sampling interval. The spread spectrum techniques may enable the information signal to be extracted from the wireless signal.

In some examples, wireless signals transmitted by some devices may interfere with the communication of wireless signals to other devices. Communications by devices within a frequency band of the receiver may interfere with one another—e.g., transmissions by the fourth device 105-4 may interfere with communications for the first device 105-1 where the first device 105-1 and the fourth device 105-4 have similar or the same frequency bands. Similarly, communications by devices that use other bands or that are performing D2D communications may interfere with other devices—e.g., transmissions by fifth device 105-5 may interfere with communications for the first device 105-1 where the fifth device 105-5 and the first device 105-1 have similar or the same frequency bands. Also, communications by devices that are targeting other devices (e.g., malicious actors) may interfere with communications for other devices—e.g., transmissions by sixth device 105-6 may interfere with communications for first device 105-1, for example, to jam a receive chain at the first device 105-1 where the first device 105-1 and the sixth device 105-6 have similar or the same frequency bands. In some examples, the interference from other devices may cause a magnitude of a signal received at a device (e.g., the first device 105-1) to increase—e.g., to a level that is close to, at, or above the dynamic range of the receiver.

To extract information signals from wireless signals (e.g., received at the first device 105-1) that are above the noise floor (e.g., due to interference), the signal converter may be configured to support direct sampling techniques. In addition, the receiver of the device may employ successive interference cancellation (SIC) and may thus extract different signals having different amounts of power both above and below the noise floor. To capture information signals in wireless signals that are above the noise floor, the signal converter may be configured to capture samples of the wireless signals using a periodic sampling interval. Additionally, to support receiving wireless signals that are above the noise floor, the signal converter may be configured with a sampling range (which may also be referred to as a dynamic range) that is large enough to capture the extremes of the wireless signals. For example, the sampling range may relate to a difference between a smallest signal level and a greatest signal level detectable by the signal converter. In some examples, when a level of the wireless signal exceeds the sampling range of the signal converter, the signal converter may output a voltage corresponding to the lowest or highest signal level detectable by the signal converter. In such cases, any variation in the wireless signal attributed to an information signal embedded within the wireless signal may be lost, and thus, the corresponding data conveyed by the information signal may be lost. When the wireless signal exceeds a detection range of the signal converter (e.g., is greater than the highest detectable signal level or is less than the lowest detectable signal level) and the signal converter outputs its highest or lowest level, a "clipping" condition may occur at the signal converter—e.g., the output of the signal converter may be referred to as "clipped."

To avoid the occurrence of a clipping condition, the signal converter may be configured to have a large sampling range—e.g., a sampling range that is large enough to encompass a high-power wireless signal level. That said, if the sampling range of the signal converter is increased without also increasing a sampling resolution of the signal converter, the signal converter may again lose the capability of detecting the information signal embedded in the received wireless signal (e.g., a low-power information signal that is hidden at or below the minimum sampling resolution, a low-power information signal that is drowned out by a higher-power interfering signal, and so forth). In some examples, the capability of detecting the information signal is lost because variations in the information signal level may happen with two levels that are separated by a unit of the sampling resolution. Thus, the signal converter may be unable to detect such variations in the information signal corresponding to different data values of the information signal.

Accordingly, to configure the signal converter to avoid the clipping condition and without losing detection capabilities, the signal converter may be configured with an increased sampling range as well as a sampling resolution that is sufficient to capture low-power information signals. To represent the different levels detectable by the signal converter, the signal converter may be configured to output digital samples with a sufficient bit-width (e.g., a sufficient quantity of bits) to do so. Thus, maintaining a desired processing capability when the sampling range is increased may cause the bit-width of digital samples output by the signal converter to increase. Accordingly, the bit-width of samples output by the signal converter configured for direct sampling (e.g., to process larger wireless signals) will often be greater than the bit-width of samples output by the signal converter configured for noise sampling. Similarly, the bit-width of samples output by the signal converter configured for direct sampling in the presence of an interfering higher-power signal may be greater than the bit-width of samples output by the signal converter configured for the minimum sampling used to support the link of a desired lower-power signal.

In some examples, the power consumption of the receiver correlates with the bit-width of digital samples generated by the receiver—e.g., for each added bit, the power consumption of the receiver may increase (e.g., double). Additionally, a rate for communicating digital samples generated by the receiver to other components of a device may be correlated with the bit-width of digital samples—e.g., as more bits are used to communicate a digital sample, less digital samples may be communicated over an interface within a duration. Also, a complexity and rate of processing digital samples generated by the receiver may be correlated with the bit-width of the digital samples—e.g., because more bits may use larger and/or more complex arithmetic components. In some examples, the increased processing complexity associated with digital samples having larger bit-widths reduces an amount of beams signals that may be output by a beamformer that receives the digital samples—e.g., if to support samples with larger bit-widths, fewer arithmetic components can be fit within the footprint of the beamformer, or, if to support samples with larger bit-widths, fewer beams may be communicated over an interface within a duration.

As suggested herein, a receiver may include a signal converter that is configured with a sampling range sufficient to capture large variations in a high-power wireless signal and that is configured with a sampling resolution high enough to capture small variations in the wireless signal. As also suggested herein, a bit-width of samples output by such a receiver may be large (e.g., larger than a noise-sampling receiver) and, thus, a power consumption of the receiver may be high (e.g., higher than a noise-sampling receiver). In some examples, during operation, a receiver may receive (e.g., intermittently, primarily, etc.) wireless signals having magnitudes that are significantly smaller than the high-power wireless signal, despite being configured for sampling a high-power wireless signal. In such cases, a signal converter having a smaller sampling range (e.g., a sampling range that is a half or a quarter of the sampling range of the signal converter configured for the high-power wireless signal) and a similar sampling resolution may be sufficient to receive the significantly smaller signals. Accordingly, during these periods of operation, the signal converter may consume excessive power and output samples with excessive bit-widths based on being configured for the high-power wireless signal. That is, the signal converter may consume the energy for receiving high-power wireless signals even though the lower power wireless signals could be processed with less energy.

To enable the receiver to process high-power wireless signals and to conserve power when processing only lower power wireless signals, the receiver may be configured with the signal converter that is capable of changing its sampling range while maintaining its sampling resolution step size at or below a sampling resolution step size threshold (e.g., a sampling resolution step size threshold associated with sampling signal values of an information signal when received as part of a high-power wireless signal or a lower power wireless signals). Maintaining the sampling resolution step size at or below the sampling resolution threshold may include increasing the sampling resolution of the receiver (e.g., decreasing the sampling resolution step size). In some examples, the sampling range of the signal converter may be adaptable by enabling and disabling one or more elements (e.g., comparators) in the signal converter such that the sampling resolution is maintained. In some examples, the sampling range of the signal converter may be adaptable, and the sampling resolution of the signal converter may be maintained by increasing or decreasing a quantity of approximation cycles applied to each analog sample. Based on adapting the sampling range of the signal converter while maintaining the sampling resolution step size at or below the sampling resolution step size threshold, a bit-width of samples output by the signal converter may change.

In some examples, a device (e.g., first device 105-1) may sample, during a first time period, a first analog signal output by an antenna array of the device. The device may sample the first analog signal in accordance with a first sampling range and a sampling resolution over the first sampling range. The device may output, during the first time period, a first digital sequence based on sampling the first analog signal. In some examples, the device may adapt the first sampling range to a second sampling range while maintaining the sampling resolution step size at or below the sampling resolution step size threshold—e.g., after sampling the first analog signal or while sampling the first analog signal. In some examples, maintaining the sampling resolution step size at or below the sampling resolution step size threshold may include increasing the sampling resolution of the receiver (e.g., using a finer sampling resolution step size).

The device may adapt the sampling range based on an interference metric, where the interference metric may be based on a magnitude of the first analog signal, a magnitude of an interference signal detected by the device, an expected level of interference in a geographic area entered by the device, a time-of-day, a scheduled transmission from the device, a scheduled or anticipated transmission of neighboring devices, etc. A width of the second sampling range (e.g., a difference between a highest and lowest value of the second sampling range) may be larger than a width of the first sampling range.

During a second time period, the device may sample a second analog signal in accordance with the second sampling range and the sampling resolution over the second sampling range. In some examples, the second analog signal is the same as the first analog signal. In some examples, a first portion of an analog signal may include the first analog signal and a second portion of the analog signal may include the second analog signal. In some examples, the first analog signal and the second analog signal may be separate signals—e.g., signals that are separated in time and not merely different portions of the same analog signal. Based on the sampling during the second time period, the device may output a second digital sequence. In some cases, the sampling resolution step size threshold may be a value that is less than a minimum of a range of an information signal in the first analog signal and the range of the information signal in the second analog signal. In some cases, the sampling resolution step size used for sampling the first analog signal may be maintained for sampling the second analog signal. That is, the sampling resolution step size used for sampling the first analog signal may not substantially change (e.g., may not change greater than 1%, or greater than 5%, or greater than 10%) for sampling the second analog signal.

In some examples, the device includes an antenna configured to receive RF signals and output an analog signal (e.g., a first analog signal and a second analog signal). The device may also include a signal converter configured to convert the first analog signal to a first digital sequence in accordance with a first sampling range and a sampling resolution, where the first sampling range of the signal converter is adaptable to a second sampling range while the sampling resolution step size of the signal converter is maintained below a sampling resolution step size threshold. In some examples, the sampling resolution may be maintained at a same level when the first sampling range is adapted to the second sampling range. The signal converter may be further configured to adapt the sampling range of the converter based on a metric of interference. The signal converter may also be configured to output the first digital sequence based on converting the first analog signal and a second digital sequence based on converting the second analog signal.

By changing the sampling range of the signal converter (while maintaining a sampling resolution step size at or below a sampling resolution step size threshold) to adapt to changing magnitudes of wireless signals, the power consumption of the receiver may be adapted to be sufficient for processing the wireless signals without losing an underlying information signal. That is, the power consumption of the receiver may be reduced when lower-power wireless signals are received and increased when higher-power wireless signals are received.

Based on changing the sampling range of the signal converter (while maintaining the sampling resolution), the bit-width of the digital samples output by the signal converter may be adapted to be sufficient for conveying all of the levels detectable by the signal converter. Based on modulating the bit-width of the digital samples, a throughput of digital samples through a system using the receiver may be increased when smaller bit-widths are used—e.g., because the bandwidth of an interface may support the communication of more digital samples in an interval.

In some examples, generating digital samples having smaller bit-widths may result in reduced processing complexity and/or power consumption throughout the system. For example, a beamformer and processor may process the digital samples using less power and with simpler arithmetic components than if larger bit-widths are used. In some examples, the beamformer may use the reduced complexity to increase a quantity of beams signals that can be generated by the beamformer. For example, the quantity of beam signals output by the beamformer may be increased when smaller bit-width digital samples are used—e.g., because a processing complexity of the digital samples may decrease or because the overall throughput of the beam data has been decreased.

Figure 2:
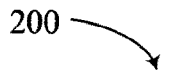
FIG. 2 shows an example of receiver that supports a signal converter with variable sampling range in accordance with examples described herein.
Figure 2:
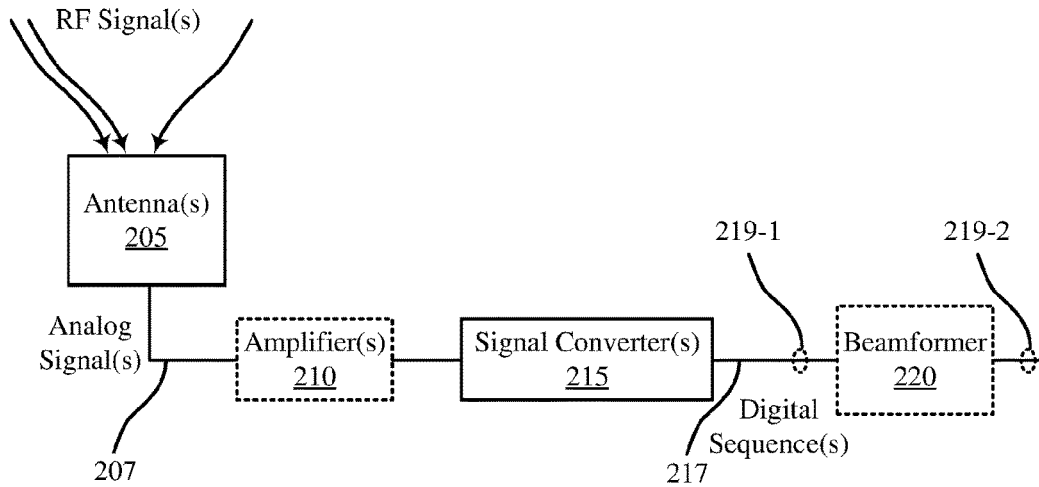

FIG. 2 illustrates an example of a receiver that supports a signal converter with a variable sampling range in accordance with examples as disclosed herein.

Receiver 200 may be configured to detect wireless signals (e.g., RF signals), convert the detected wireless signals to digital signals, and process the digital signals to obtain beam signals, or any combination thereof. Receiver 200 may include one or more antennas 205, one or more amplifiers 210, one or more signal converters 215, interfaces 219, and beamformer 220.

An antenna of the one or more antennas 205 may be configured to detect wireless signals transmitted to a device that includes receiver 200. In some examples, an antenna array includes the one or more antennas 205. For example, the antennas of the one or more antennas 205 may be evenly spaced on an antenna panel to form the antenna array. The wireless signals may be detected at the antennas of the antenna array with varying magnitudes and phases—e.g., based on a position, tilt, or both of the antennas.

An amplifier of the one or more amplifiers 210 may be configured to amplify low-power signals (e.g., a signal detected by a respective antenna) with little to no effect on the signal-to-noise ratio of the low-power signal. One or more amplifiers 210 may include one or more low noise amplifiers. In some examples, respective low-noise amplifiers are coupled with respective antennas of the one or more antennas 205.

A signal converter of the one or more signal converters 215 may be configured to convert one or more analog signals 207 to one or more digital sequences 217. In some examples, respective signal converters of the one or more signal converters 215 are coupled with respective amplifiers of the one or more amplifiers 210. In such cases, a signal converter of the one or more signal converters 215 may receive an analog signal of the one or more analog signals 207 that is amplified from an amplifier of the one or more amplifiers 210 of the one or more amplifiers 210. In other examples, respective signal converters of the one or more signal converters 215 are coupled with respective antennas of the one or more antennas 205. In such cases, a signal converter of the one or more signal converters 215 may receive an analog signal of the one or more analog signals 207 from an antenna of the one or more antennas 205.

To convert the one or more analog signals 207 to one or more digital sequences 217, respective signal converters of the one or more signal converters 215 may be configured to sample a respective analog signal of the one or more analog signals 207 (e.g., in accordance with a periodic sampling interval). For each sample of the respective analog signal taken by the respective signal converter, the respective signal converter may be configured to output a digital representation of the corresponding sample (which may be referred to as a digital sample). The digital sample may be represented using one or more bits. In some examples, the quantity of bits used to represent the digital sample is based on a quantity of levels that can be detected by the signal converter. For example, as more levels can be detected, more bits may be used to represent the digital sample—e.g., a one-bit digital sample may be used if up to two levels are detectable, a two-bit digital sample may be used if up to four levels are detectable, a three-bit digital sample may be used if up to eight levels are detectable, and so on. The respective signal converter may output, via first interface 219-1, a digital sample stream including the digital samples taken of the respective analog signal. In some examples, the respective signal converter may receive multiple analog signals of the one or more analog signals 207 and may output multiple digital sequences of the one or more digital sequences 217, where each digital sequence may include a digital sample stream for each analog signal of the one or more analog signals 207 received at the signal converter.

The quantity of levels that are detectable by a signal converter may be based on a sampling range of the signal converter, where the sampling range may be a difference between a lowest level (e.g., 0V) detectable by the signal converter and a highest level (e.g., 1V) detectable by the signal converter. The quantity of levels that are detected may further be based on a sampling resolution step size of the signal converter. Accordingly, the quantity of levels that are detectable by the signal converter may be obtained by dividing the range of the signal converter by the sampling resolution step size—e.g., for a sampling range that spans one volt and a sampling resolution step size of a tenth of a volt, the quantity of detectable levels would be equal to ten.

As described herein, to enable the processing of low-power signals (e.g., signals that are at or below the noise floor) as well as high-power signals, the signal converter 215 may be configured with the sampling range that is large enough to support the voltage range of the high-power signals while maintaining the sampling resolution step size to detect the low-power signals. Accordingly, a quantity of bits used to represent a digital sample obtained by a signal converter that is configured to process both high and low-power signals may be increased relative to a signal converter that is configured to process signals within a smaller range. As also described herein, as a quantity of bits output by a signal converter increases, the power consumption of the signal converter may also increase. Accordingly, during periods of time when the signal converter receives low-power signals that are able to be processed with a smaller sampling range, the signal converter may unnecessarily consume power when outputting the digital samples including a quantity of bits that is sufficient to resolve all of the sampling levels distributed across the sampling range—e.g., while a smaller quantity of bits may be used to represent the digital samples.

To reduce power consumption, a sampling range of the signal converter may be adaptable based on a magnitude of signals currently being input to the signal converter while the sampling resolution step size of the signal converter may be maintained at a same resolution or below a sampling resolution step size. For example, while receiving low-power signals, the sampling range of the signal converter may be adapted to a first range and while receiving high-power signals, the sampling range of the signal converter may be adapted to a second range that is larger than the first range. Accordingly, a quantity of bits used to represent digital samples output by the signal converter may similarly be adaptable based on the magnitude of signals currently being input to the signal converter. For example, while receiving low-power signals, the bit-width of digital samples output by the signal converter may be adapted to a first bit-width and while receiving high-power signals, the bit-width of digital samples output by the signal converter may be adapted to a second bit-width that is larger than the first bit-width.

The signal converter may be configured to determine when to adapt the configured sampling range based on the wireless signal detected by the one or more antennas 205 (e.g., interference metrics associated with the wireless signal, a magnitude of the wireless signal, etc.), based on a control signal (e.g., received from a controller or circuitry used to monitor the one or more analog signals 207), or both. Options for implementing and adapting the one or more signal converters 215 are described in more detail herein.

Additionally, during periods of time when the signal converter receives low-power signals that are able to be processed with a smaller sampling range, the signal converter may output digital samples with an excessive quantity of bits—e.g., where the most significant bits of the digital samples may be zeros. Outputting digital samples with unused bits may decrease a throughput of information through receiver 200—e.g., where buffers are used to hold data before it is passed to a next component. Thus, decreasing the bit-width of the digital samples may increase a throughput of information through receiver 200—e.g., by communicating less data to convey a same quantity of digital samples.

First interface 219-1 may be configured to convey data from the one or more signal converters 215 to other components in a device that includes receiver 200. In some examples, first interface 219-1 may be configured to communicate data up to an upper data rate (which may be referred to as an achievable data rate). The achievable data rate of first interface 219-1 may be measured in bits or bytes per second (e.g., 10 GB/s). In some examples, the achievable sample rate of first interface 219-1 (the rate at which digital samples may be communicated over first interface 219-1) may be based on the achievable data rate and a bit-width of the digital samples—e.g., the achievable sample rate may be determined by dividing the achievable data rate by the bit-width of the digital samples).

Beamformer 220 may be configured to generate beam signals based on a set of digital sample streams received from the one or more signal converters 215. To generate the beam signals, beamformer 220 may apply beam weights to time-aligned digital samples received in the set of digital samples to obtain beam signals, where each beam weight may include a set of beam coefficients for each beam signal generated by beamformer 220. Based on applying the beam weights, beamformer 220 may obtain multiple weighted versions of the time-aligned digital samples. To generate the beam signals, beamformer 220 may further add, for each beam signal, a respective weighted version of the time-aligned digital samples to obtain a beam sample for a beam signal, where a beam signal may include successive beam samples.

As described herein, adapting the bit-width of digital samples output by the one or more signal converters 215 may result in the increased throughput of data in receiver 200. Similarly, adapting the bit-width of the digital samples may decrease a processing burden on beamformer 220 when the signal converter receives low-power signals that are detectable with a smaller sampling range—e.g., by simplifying the arithmetic operations performed by beamformer 220.

In some examples, the reduction in processing complexity at beamformer 220 may enable the beamformer 220 to generate an increased quantity of beam signals when the signal converter receives low-power signals that are able to be processed with a smaller sampling range. In some examples, beamformer 220 may be configured with a variable-bit adder that can be used to add two digital samples having a first bit-width at a time or to simultaneously add two sets of two digital samples having a smaller second bit-width at a time.

In some examples, beamformer 220 determines whether to adapt the quantity of beam signals based on the wireless signal detected by the one or more antennas (e.g., interference metrics associated with the wireless signal, a magnitude of the wireless signal, etc.), based on a control signal (e.g., received from the one or more signal converters 215), or both. Options for implementing and adapting the output of beamformer 220 are described in more detail herein.

Second interface 219-2 may be configured to convey data from beamformer 220 to other components (e.g., a processor) in a device that includes receiver 200. In some examples, second interface 219-2 may be configured to communicate data up to an achievable data rate, which may be equivalent to or greater than the achievable data rate of first interface 219-1. In some examples, beamformer 220 may determine a quantity of beam signals to output based on an achievable data rate of second interface 219-2, a bit-width of digital samples received from the one or more signal converters 215, and a rate at which digital samples are received from the one or more signal converters 215 (which may correspond to a sampling frequency of the one or more signal converters 215). For example, if the one or more signal converters 215 maintains a sampling frequency when a bit-width of digital sample is decreased, beamformer 220 may output an increased quantity of beam signals—e.g., based on a data throughput over first interface 219-1 decreasing below a threshold.

Figure 3A:
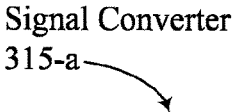
FIGS. 3A through 4B show examples of a signal converter with variable sampling range in accordance with examples described herein.
Figure 3A:
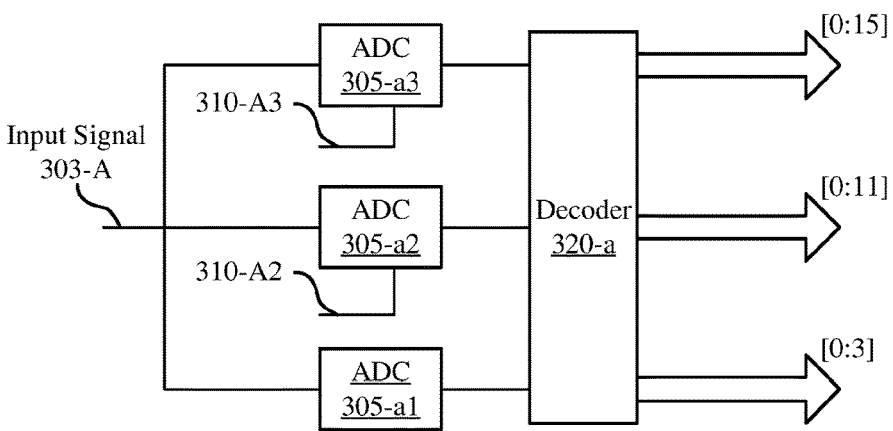

FIG. 3A illustrates an example of a signal converter 315-a with variable sampling range in accordance with examples as disclosed herein.

Signal converter 315-a may be configured to output a stream of digital samples (which may be referred to as a digital sample stream), where the digital samples may have different bit-widths based on toggling an activation of one or more of the component ADCs 305-a. Signal converter 315-a may be configured to adapt the bit-widths of the digital samples based on input signal 303-a received at signal converter 315-a—e.g., a magnitude of input signal 303-a, interference metrics associated with the input signal 303-a, etc. Input signal 303-a may be equivalent to an analog signal output by an antenna (e.g., an analog signal of the one or more analog signals 207 of FIG. 2) or an amplified version of an analog signal output by an amplifier coupled with the antenna. Signal converter 315-a may be an example of the one or more signal converters 215 of FIG. 2.

Signal converter 315-a may include first component ADC 305-a1, second component ADC 305-a2, third component ADC 305-a3, and decoder 320-a. Signal converter 315-a may toggle an activation of second component ADC 305-a2, third component ADC 305-a3, or both, based on a desired sampling range and bit-width for digital samples output by signal converter 315-a. In some examples, a signal for enabling/disabling third component ADC 305-a3 may be received via third enable line 310-a3, and a signal for enabling/disabling second component ADC 305-a2 may be received via second enable line 310-a2.

In some examples, to achieve a first sampling range and output digital samples with a first bit-width (corresponding to a sampling resolution step size), signal converter 315-a may disable second component ADC 305-a2 and third component ADC 305-a3, while the first component ADC 305-a1 may be enabled. To achieve a second sampling range and output digital samples with a second bit-width, signal converter 315-a may disable third component ADC 305-a3, while first component ADC 305-a1 and second component ADC 305-a2 may be enabled. And to achieve a third sampling range and output digital samples with a third bit-width (e.g., corresponding to the sampling resolution step size), signal converter 315-a may enable each of the component ADCs 305-a. The third sampling range and third bit-width may be larger than the second sampling range and second bit-width, and the second sampling range and the second bit-width may be larger than the first sampling range and the first bit-width. In some examples, the sampling resolution of signal converter 315-a may be maintained independent of changes to the sampling range of signal converter 315-a. In some examples, the sampling resolution of signal converter 315-a may change when the sampling range of signal converter 315-a is adapted, but the sampling resolution step size may remain at or below a sampling resolution step size threshold.

In some examples, the component ADCs 305-a may be configured to indicate a quantized level of input signal 303-a by reference to a set of threshold levels supported by the component ADCs 305-a. For example, first component ADC 305-a1 may compare input signal 303-a with a first set of threshold levels; second component ADC 305-a2 may compare input signal 303-a with a second set of threshold levels; and third component ADC 305-a3 may compare input signal 303-a with a third set of threshold levels. In some examples, the first set of threshold levels may span a first range in accordance with a first resolution, the second set of threshold levels may span a second range in accordance with a second resolution (which may be the same as or similar to the first resolution), and the third set of threshold levels may span a third range in accordance with a third resolution (which may be the same as or similar to the first resolution). Based on comparing input signal 303-a with the set of levels, the component ADCs 305-a may output a code that indicates the analog level of input signal 303-a.

Decoder 320-a may be configured to convert the code output by the component ADCs 305-a to a multi-bit digital sample that includes a binary representation of the analog level of input signal 303-a. In some examples, the bit-width of the digital sample output by decoder 320-a is based on whether second component ADC 305-a2 and third component ADC 305-a3 are enabled or disabled. For example, if second component ADC 305-a2 and third component ADC 305-a3 are disabled, decoder 320-a may output digital samples having a first bit-width based on an output of first component ADC 305-a1 (which may correspond to bits zero to three of four-bit digital samples output by the so configured decoder 320-a). In another example, if third component ADC 305-a3 is disabled, decoder 320-a may output digital samples having a second bit-width based on a combined output of first component ADC 305-a1 and second component ADC 305-a2 (which may correspond to bits zero to eleven of twelve-bit digital samples output by the so configured decoder 320-a). In another example, if none of the component ADCs 305-a are disabled, decoder 320-a may output digital samples having a third bit-width based on a combined output of first component ADC 305-a1, second component ADC 305-a2, and third component ADC 305-a3 (which may correspond to bits zero to fifteen of sixteen-bit digital samples output by the so configured decoder 320-a). The third bit-width may be larger than the second bit-width, and the second bit-width may be larger than the first bit-width.

In some examples, an indication of which of the component ADCs 305-a is enabled/disabled may be provided to decoder 320-a. In such cases, if decoder 320-a is provided with an indication that third component ADC 305-a3 is disabled, decoder 320-a may ignore an output of third component ADC 305-a3 and may configure circuitry for outputting digital samples having a second bit-width, for example. In some examples, decoder 320-a may drop a first set of leading bits (e.g., bits twelve to fifteen) of the digital sample based on receiving the indication that third component ADC 305-a3 is disabled.

In some examples, a DC offset may be applied to input signal 303-a based on which of the component ADCs 305-a are enabled/disabled. For example, the DC offset may be applied to center input signal 303-a between a lower limit and upper limit of the configured sampling range of signal converter 315-a. For example, if third component ADC 305-a3 is disabled, the DC offset may be configured to center input signal 303-a between a lower limit of the second sampling range and an upper limit of the second sampling range that is configured for signal converter 315-a by using first component ADC 305-a1 and second component ADC 305-a2. Alternatively, if the second component ADC 305-a2 and the third component ADC 305-a3 are disabled, the DC offset may be configured to center input signal 303-a between a lower limit of the first sampling range and an upper limit of the first sampling range that is configured for the signal converter 315-a by using the first component ADC 305-a1, and so forth.

Figure 3B:
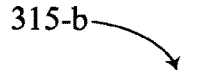
Figure 3B:
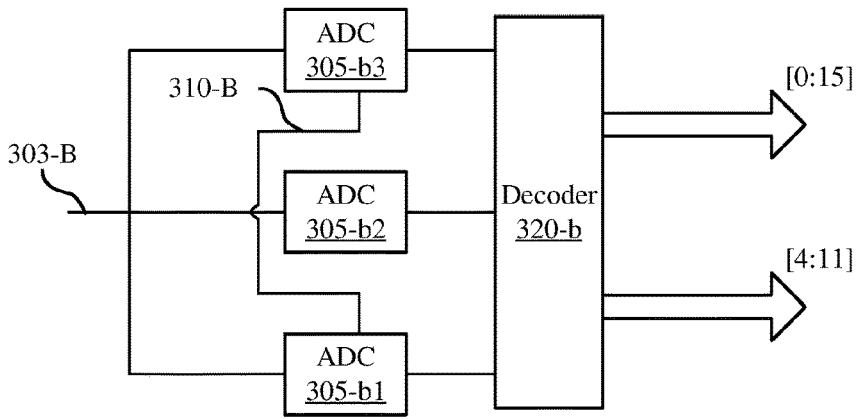

FIG. 3B illustrates an example of a signal converter 315-b with variable sampling range in accordance with examples as disclosed herein.

Signal converter 315-b may be configured to output a stream of digital samples based on enabling or disabling one or more of the component ADCs 305-b, as similarly described with reference to signal converter 315-a. In some examples, signal converter 315-b may be configured to output digital samples having a first bit-width or a second bit-width. Signal converter 315-b may be an example of the one or more signal converters 215 of FIG. 2. Signal converter 315-b may include first component ADC 305-b1, second component ADC 305-b2, third component ADC 305-b3, and decoder 320-b.

As similarly described with reference to FIG. 3A, first component ADC 305-b1 may compare input signal 303-b with a first set of threshold levels, second component ADC 305-b2 may compare input signal 303-b with a second set of threshold levels, and third component ADC 305-b3 may compare input signal 303-b with a third set of threshold levels. The third set of threshold levels may be higher than the second set of threshold levels, and the second set of threshold levels may be higher than the first set of threshold levels. Input signal 303-b may be equivalent to an analog signal output by an antenna (e.g., an analog signal of the one or more analog signals 207 of FIG. 2) or an amplified version of an analog signal output by an amplifier coupled with the antenna.

Signal converter 315-b may toggle an activation of first component ADC 305-b1 and third component ADC 305-b3 based on a desired sampling range and bit-width for digital samples. For example, to achieve a first sampling range and output digital samples with a first bit-width, signal converter 315-b may disable first component ADC 305-b1 and third component ADC 305-b3. To achieve a second sampling range and output digital samples with a second bit-width, signal converter 315-b may enable first component ADC 305-b1 and third component ADC 305-b3. The second sampling range and second bit-width may be larger than the first sampling range and first bit-width. In some examples, a signal for enabling/disabling first component ADC 305-b1 and third component ADC 305-b3 may be received via enable line 310-b.

Based on maintaining second component ADC 305-b2 in an active state throughout an operation of signal converter 315-b, an operation for adding a DC offset to an input signal 303-b may be omitted. That is, the sampling range of signal converter 315-b may remain centered around a common level regardless of whether only second component ADC 305-b2 is enabled or all of the component ADCs 305-b are enabled. Thus, the DC offset may not be applied to input signal 303-b to center input signal 303-b between the lower limit and upper limit of the sampling range as different combinations of the component ADCs 305-b are enabled/disabled.

Additionally, as similarly described with reference to FIG. 3A, decoder 320-b may be configured to convert a code output by the component ADCs 305-b to a multi-bit digital sample. Based on maintaining the sampling range of signal converter 315-b centered around a common level, when first component ADC 305-b1 and third component ADC 305-b3 are disabled, decoder 320-b may be configured to use the intermediary bits of the multi-bit digital sample (e.g., bits

[4:11]) that correspond to second ADC 305-*b*2—e.g., as the intermediary bits may correspond to an intermediary range of the sampling range. Alternatively, when each of the component ADCs 305-*b* are enabled, the decoder 320-*b* may be configured to use all of the bits of the multi-bit digital sample (e.g., bits [0:15])—e.g., as all of the bits may correspond to the full range of the sampling range.

Figure 4A:
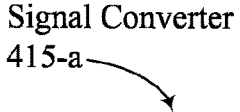
Figure 4A:
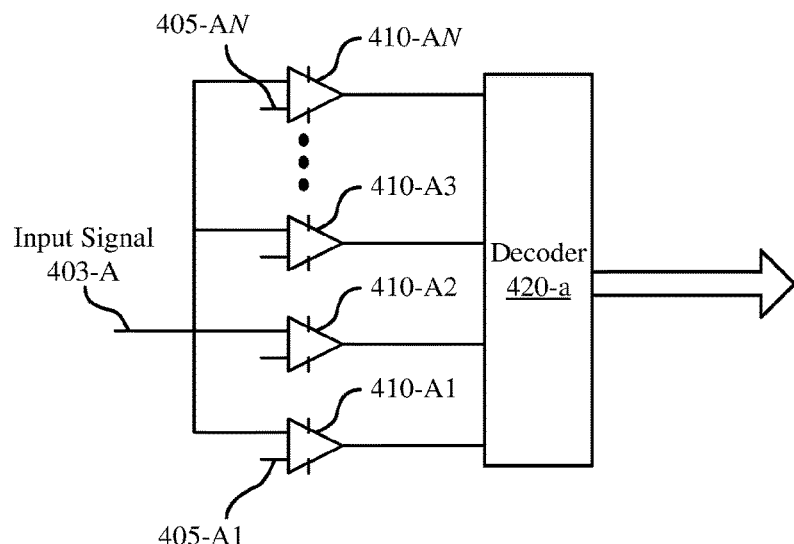

FIG. 4A illustrates an example of a signal converter 415-*a* with variable sampling range in accordance with examples as disclosed herein.

Signal converter 415-*a* may include comparators 410-*a* (e.g., comparators 410-*a*1, 410-*a*2, 410-*a*3, 410-aN) and decoder 420-*a*. Signal converter 415-*a* may be configured to output digital samples having different bit-widths based on enabling or disabling sets of the comparators 410-*a*. Signal converter 415-*a* may be an example of the one or more signal converters 215 of FIG. 2, signal converter 315-*a* of FIG. 3A, or signal converter 315-*b* of FIG. 3B.

In some examples, each of the comparators 410-*a* may compare a received input signal 403-*a* with a respective threshold level received via a respective threshold line 405-*a*. In some examples, if a voltage of the input signal 403-*a* is above a respective threshold voltage input into a comparator of the comparators 410-*a*, the comparator may output a high voltage. Conversely, if a voltage of the analog signal is below a threshold voltage, the comparator may output a low voltage. Input signal 403-*a* may be equivalent to an analog signal output by an antenna (e.g., an analog signal of the one or more analog signals 207 of FIG. 2) or an amplified version of an analog signal output by an amplifier coupled with the antenna.

Decoder 420-*a* (which may be an example of decoder 320-*a* or decoder 320-*b* of FIGS. 3A and 3B, respectively) may receive voltages from the comparators 410-*a*. The voltages received from the comparators 410-*a* (which may also be referred to as a unary code) may be based on which of the comparators 410-*a* are outputting high and low voltages, where decoder 420-*a* may output a digital sample having a bit pattern corresponding to the combined signal output by the comparators 410-*a* (e.g., thereby, performing a unary code to binary code conversion), relative to the description of decoder 320-*a* herein. The quantity of bits per digital sample output by decoder 420-*a* may be based on a quantity of the comparators 410-*a*. In some examples, if N bits are output by decoder 420-*a* per digital sample, signal converter 415-*a* may be configured with ($2^N$−1) comparators 410-*a*, where more comparators 410-*a* consume more power. The power consumption of signal converter 415-*a* may increase exponentially as digital samples with larger bit-widths are output by decoder 420-*a*.

The threshold voltages applied to the comparators 410-*a* may also be based on the quantity of bits per digital sample. For example, the threshold voltage applied to N$^{th}$ threshold line 405-aN may be equal to $$\frac{\left(\left(2^N - 1\right) * \text{Dynamic Range}\right)}{2^N};$$

the threshold voltage applied to the (N−1)$^{th}$ threshold line may be equal to $$\frac{\left(\left(2^N - 2\right) * \text{Dynamic Range}\right)}{2^N};$$

and so on until the threshold voltage applied to first threshold line 405-*a*1 may be equal to $$\frac{\left(\left(2^N - N\right) * \text{Dynamic Range}\right)}{2^N}.$$

As described herein, based on input signal 403-*a* to the signal converter 415-*a* (e.g., based on a magnitude of input signal 403-*a*, an interference to input signal 403-*a*, etc.), different combinations of the comparators 410-*a* may be enabled/disabled. In some examples, a magnitude of input signal 403-*a* exceeds a first threshold and a first set of the comparators 410-*a* and second set of the comparators 410-*a* may be enabled, while a third set of the comparators 410-*a* may be disabled. In such cases, the power consumption of signal converter 415-*a* may be reduced relative to a scenario where all of the comparators 410-*a* are enabled. Additionally, the threshold of the sampling range of the signal converter 415-*a* may be increased or reduced. In some examples, the threshold levels applied to the comparators 410-*a* may be adapted, based on the equations provided above, to ensure the threshold levels are evenly distributed across the enabled comparators of the comparators 410-*a*. In some examples, the threshold levels are maintained (e.g., if consecutive groups of the comparators 410-*a* are enabled/ disabled together). That is, the signal converter 415-*a* may allow the sampling range to be increased or reduced independently of the threshold levels (e.g., independent of the sampling resolution step size).

In some examples, the first set of the comparators 410-*a* corresponds to the upper portion of the comparators 410-*a* and a first set of bits (e.g., [12:15]) of a digital sample output by decoder 420-*a*, the second set of the comparators 410-*a* corresponds to the middle portion of the comparators 410-*a* and a second set of bits (e.g., [4:11]) of the digital sample, and the third set of the comparators 410-*a* corresponds to a lower portion of the comparators 410-*a* and a third set of bits (e.g., [0:3]) of the digital sample.

In some examples, decoder 420-*a* may determine that the third set of comparators 410-*a* is disabled and may switch to a mode associated with outputting digital samples with reduced bit-widths. That is, decoder 420-*a* may map the outputs of the enabled comparators 410-*a* to binary representations having a fewer quantity of bits (e.g., bits [0:11]) than if the third set of comparators 410-*a* were also enabled (e.g., bits [0:15]). In some examples, to map the outputs of the comparators 410-*a* to a binary representation having fewer bits, decoder 420-*a* may drop the leading bits (e.g., bits [12:15]) of binary representations that correspond to the outputs of the third set of comparators 410-*a*. Accordingly, the digital samples of input signal 403-*a* generated while the third set of comparators 410-*a* are disabled may, for example, include bits [0:11] and have a smaller bit-width than if the third set of comparators 410-*a* were enabled.

In some examples, the magnitude of input signal 403-*a* may be at or below the first threshold and only the first set of the comparators 410-*a* may be enabled. In such cases, decoder 420-*a* may determine that only the first set the comparators 410-*a* is enabled and output digital samples having a bit-width that is further decreased relative to if the second set of comparators 410-*a* were enabled—e.g. a digital sample including bits [0:3] by dropping the bits corresponding to the outputs of the second set of comparators 410-*a* (e.g., bits [4:11]).

In some examples, the magnitude of input signal 403-*a* may be above a second threshold, and the first, second, and third sets of the comparators 410-*a* may be enabled. In such cases, decoder 420-*a* may determine that the first, second, and third sets of the comparators 410-*a* are enabled and output digital samples having an increased bit-width relative to if only the first set of comparators 410-*a* or the first and second sets of comparators 410-*a* were enabled—e.g., a digital sample including bits [0:15].

In some examples, signal converter 415-*a* may include multiple stages of the components shown in FIG. 4A—e.g., to achieve a higher resolution and to reduce the exponential growth of comparators used to support growing bit-widths. In such cases, the power consumption for signal converter 415-*a* may be a function of the quantity of comparators included in a stage and the quantity of stages.

Figure 4B:
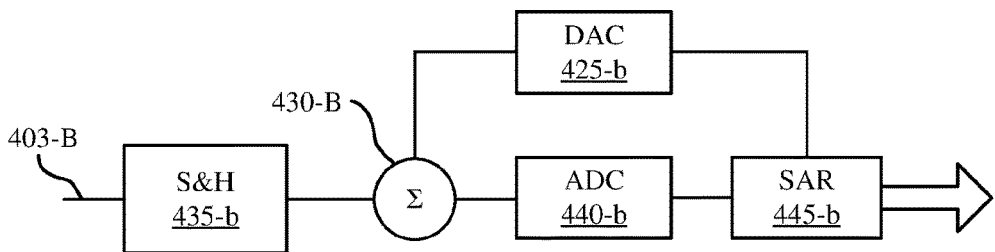

FIG. 4B illustrates an example of a signal converter 415-*b* with variable sampling range in accordance with examples as disclosed herein.

Signal converter 415-*b* may be configured to output a stream of digital samples (which may be referred to as a digital sample stream), where the digital samples may have different bit-widths based on adapting a quantity of approximation cycles used to determine a digital representation of individual analog samples. Signal converter 415-*b* may include digital-to-analog converter 425-*b*, sample-and-hold circuit 435-*b*, subtractor 430-*b*, analog-to-digital converter 440-*b*, successive approximation register 445-*b*. Signal converter 415-*b* may be an example of the one or more signal converters 215 of FIG. 2.

Sample-and-hold circuit 435-*b* may be configured to sample input signal 403-*b* at a first time when input signal 403-*b* has a first voltage level and to hold the sampled voltage level of input signal 403-*b* for a period of time. Subtractor 430-*b* may be configured to subtract the sampled voltage level and a discretized voltage level output by digital-to-analog converter 425-*b* to generate a result output. Input signal 403-*b* may be equivalent to an analog signal output by an antenna (e.g., an analog signal of the one or more analog signals 207 of FIG. 2) or an amplified version of an analog signal output by an amplifier coupled with the antenna.

Analog-to-digital converter 440-*b* may be configured to convert the voltage level of the result output by subtractor 430-*b* (which may be in an analog domain) to a quantized voltage level (e.g., either a low voltage (e.g., 0V) or a high voltage (e.g., 1V) as a digital sample. In some examples, analog-to-digital converter 440-*b* may be a comparator. Successive approximation register 445-*b* may be configured to determine a series of bits that make up the digital sample generated by the analog-to-digital converter 440-*b* based on each approximation cycle of the signal converter 415-*b*. Digital-to-analog converter 425-*b* may be configured to output an analog voltage level to subtractor 430-*b* based on input signal 403-*b* received from successive approximation register 445-*b*.

The following description describes the operation of the components of signal converter 415-*b* by way of an example where signal converter 415-*b* has a first sampling range (e.g., of 1V) and an input signal 403-*b* applied to sample-and-hold circuit 435-*b* has a voltage level (e.g., 0.65V) at a beginning of a sampling period. At the beginning of the sampling period, sample-and-hold circuit 435-*b* may capture the voltage level of input signal 403-*b* at the beginning of the sampling period. Sample-and-hold circuit 435-*b* may output the captured voltage level throughout the sampling period.

In a first approximation cycle within the sampling period, the captured voltage level of input signal 403-*b* may be provided to subtractor 430-*b*. Also, successive approximation register 445-*b* may provide a digital code to digital-to-analog converter 425-*b* that corresponds to only a most significant bit of the digital code being equal to one (e.g., $\underline{1}00 \ldots 0$)—this code may correspond to a voltage level in the middle of the sampling range of signal converter 415-*b*. Accordingly, digital-to-analog converter 425-*b* may output, to subtractor 430-*b*, a voltage level (e.g., 0.5V) in the middle of the sampling range of signal converter 415-*b*. In some examples, the quantity of bits included in the digital code may correspond to a quantity of approximation cycles performed per sampling period—e.g., each bit of the digital code may be associated with an approximation cycle of the quantity of approximation cycles.

Subtractor 430-*b* may subtract the voltage level output from digital-to-analog converter 425-*b* from the voltage level output from sample-and-hold circuit 435-*b*. Accordingly, a positive voltage level (e.g., 0.15V) may be output to analog-to-digital converter 440-*b*. Based on the positive voltage level output by subtractor 430-*b*, analog-to-digital converter 440-*b* may output a high voltage level (e.g., 1V) to successive approximation register 445-*b*. Based on analog-to-digital converter 440-*b* outputting the high voltage level, successive approximation register 445-*b* may determine that the most significant bit of the digital sample is equal to 1 and, thus, may maintain the most significant bit of the digital code as 1.

In a second approximation cycle within the sampling period, the captured voltage level (e.g., 0.65V) of input signal 403-*b* may still be provided to subtractor 430-*b*. Also, successive approximation register 445-*b* may provide the digital code to digital-to-analog converter 425-*b*, where the second most significant bit of the existing code may be set to 1 (e.g., $1\underline{1}0 \ldots 0$). Accordingly, digital-to-analog converter 425-*b* may output a voltage level (e.g., 0.75V) between the middle of the sampling range and the top of the sampling range to subtractor 430-*b*. Subtractor 430-*b* may subtract the voltage level output from digital-to-analog converter 425-*b* from the voltage level output from sample-and-hold circuit 435-*b*. Accordingly, a negative voltage level (e.g., −0.1V) may be output to analog-to-digital converter 440-*b*. Based on the negative voltage level output by subtractor 430-*b*, analog-to-digital converter 440-*b* may output a low voltage level (e.g., 0V). Based on analog-to-digital converter 440-*b* outputting a low voltage level, successive approximation register 445-*b* may determine that the second most significant bit of the digital sample is equal to 0 and, thus, may change the digital code so that the second most significant bit of the code is set to 0 (e.g., $1\underline{0}0 \ldots 0$).

In a third approximation cycle within the sampling period, the captured voltage level (e.g., 0.65V) of input signal 403-*b* may still be provided to subtractor 430-*b*. Also, successive approximation register 445-*b* may provide the digital code to digital-to-analog converter 425-*b*, where the third most significant bit of the existing code may be set to 1 (e.g., $10\underline{1} \ldots 0$). The updated code may be provided to digital-to-analog converter 425-*b*, which may output a corresponding analog voltage level. During the third approximation cycle, the voltages of sample-and-hold circuit 435-*b* and digital-to-analog converter 425-*b* may again be compared, and successive approximation register 445-*b* may determine whether to keep the third most significant bit of the code as a 1 or change it to a 0.

The above process may continue for up to N approximation cycles within the sampling period. With each approximation cycle, another bit of the code may be determined and, thus, a digital representation of the voltage level output by sample-and-hold circuit 435-*b* may be determined with increased precision and with a higher resolution than exists with the prior approximation cycle. In some examples, to obtain a same resolution when a larger sampling range is configured for signal converter 415-*b* as for a smaller sampling range, a quantity of approximation cycles performed within a sampling period may be increased (e.g., proportionally). The power consumed by signal converter 415-*b* per digital sample may increase (e.g., proportionally) with the number of approximation cycles performed during a sampling period.

As described herein, based on the signal input to signal converter 415-*b* (e.g., based on a magnitude of input signal 403-*b*, an interference to input signal 403-*b*, etc.), different quantities of approximation cycles may be configured within a sampling period. In some examples, if the magnitude of input signal 403-*b* is below a first threshold, the sampling range of the signal converter 415-*b* may be set to a first sampling range and a first quantity of approximation cycles may be configured within the sampling period—e.g., to achieve a sampling resolution for the first sampling range. In some examples, if the magnitude of input signal 403-*b* is at or above the first threshold, the sampling range of the signal converter 415-*b* may be set to a second sampling range and a second quantity of approximation cycles may be configured within the sampling period. In some examples, the second quantity of approximation cycles is selected to maintain the sampling resolution. In some examples, if the magnitude of input signal 403-*b* is at or above a second threshold, the sampling range of the signal converter 415-*b* may be set to a third sampling range and a third quantity of approximation cycles may be configured within the sampling period. In some examples, the third quantity of approximation cycles is selected to maintain the sampling resolution. The third sampling range and the third quantity of approximation cycles may be greater than the second sampling range and the second quantity of approximation cycles, and the second sampling range and the second quantity of approximation cycles may be greater than the first sampling range and the first quantity of approximation cycles. In some examples, the sampling resolution is maintained independent of adapting the sampling range of signal converter 415-*b*. In some examples, the sampling resolution step size is maintained below a sampling resolution step size threshold independent of adapting the sampling range of signal converter 415-*b*.

Figure 5:
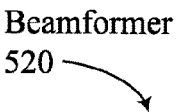
FIG. 5 shows an example of a beamformer that supports a signal converter with variable sampling range in accordance with examples described herein.
Figure 5:
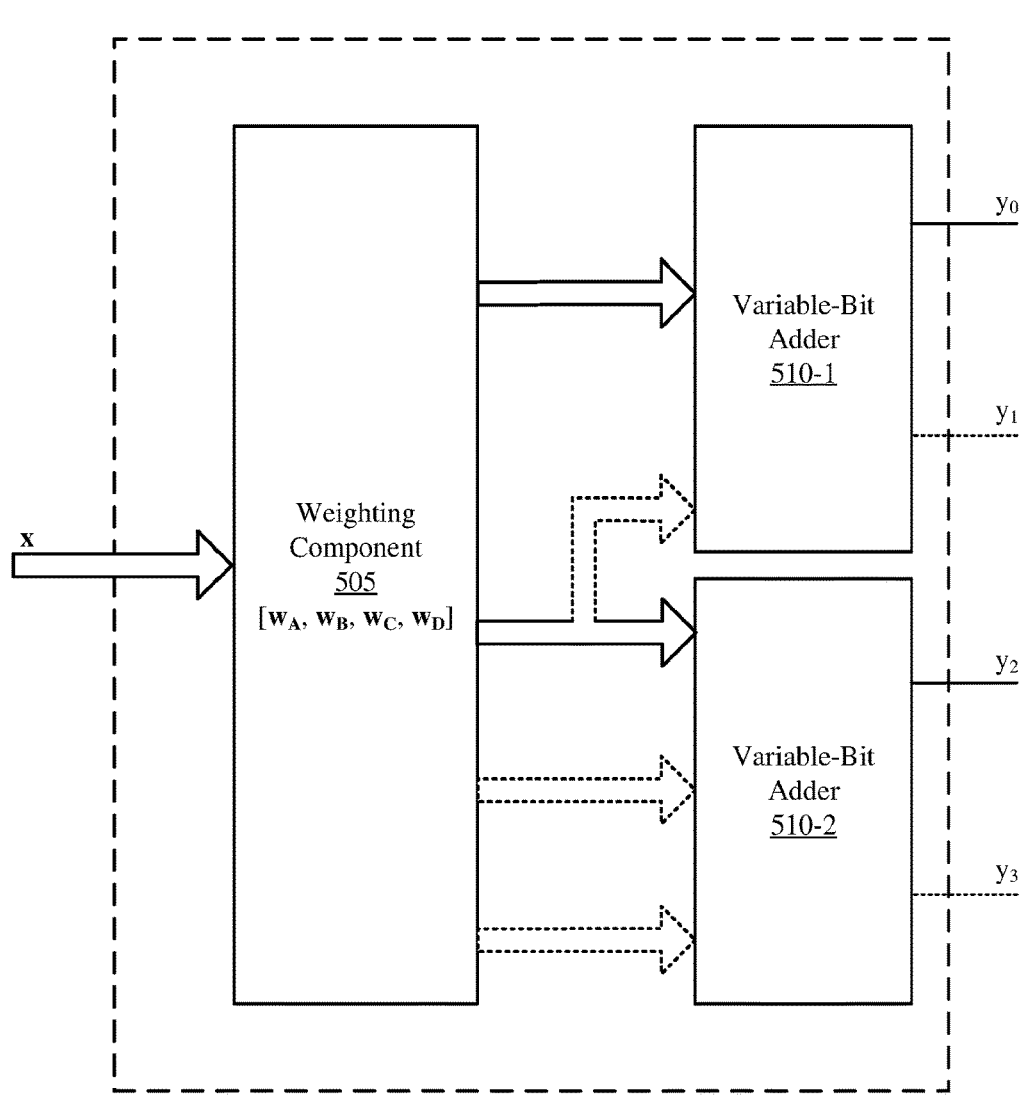

FIG. 5 illustrates an example of a beamformer 520 that supports a signal converter with variable sampling range in accordance with examples as disclosed herein.

Beamformer 520 may be configured to process digital versions of an analog signal detected by an array of antennas (e.g., after processing by amplifiers, signal converters, etc.). Beamformer 520 may be further configured to apply beam weight sets to the digital versions to generate multiple beam signals that correspond to different signals embedded within the analog signal, where the different signals may be received at the array of antennas from different directions. Each beam weight set may correspond to a respective beam signal and include a set of beam coefficients. Beamformer 520 may include a weighting component 505 and variable-bit adders 510. Beamformer 520 may be an example of beamformer 220 of FIG. 2.

Weighting component 505 may be configured to apply the beam weight sets to digital samples of a digital sample stream received at weighting component 505 (e.g., from a signal converter, such as the one or more signal converters 215 of FIG. 2). During a first interval, weighting component 505 may receive a set of digital samples, x (which may include digital samples [$x_0$, $x_1$, $x_2$, $x_3$]), corresponding to the digital versions of the analog signal received at each antenna of the antenna array. For example, $x_0$ may correspond to a digital sample of a first digital version of the analog signal received at a first antenna of the antenna array; $x_1$ may correspond to a digital sample of second digital version of the analog signal received at a second antenna of the antenna array; $x_2$ may correspond to a third digital version of the analog signal received at a third antenna of the antenna array; and $x_3$ may correspond to a fourth digital version of the analog signal received at a fourth antenna of the antenna array.

Weighting component 505 may apply each beam weight set to the received set of digital samples. For example, weighting component 505 may apply the first beam weight set $w_A$ (which may include beam coefficients [$w_{A0}$, $w_{A1}$, $w_{A2}$, $w_{A3}$]) to the set of digital samples [$x_0$, $x_1$, $x_2$, $x_3$], and the second beam weight set $w_B$ to the set of digital samples. In some examples, weighting component 505 may also apply the third beam weight set $w_C$ to the set of digital samples and the fourth beam weight set $w_D$ to the set of digital samples—e.g., based on a bit-width of the digital samples. In some examples, weighting component 505 include one or more multipliers that are used to multiply a digital sample by a corresponding beam coefficient. After applying the beam weight sets to the set of digital samples, weighting component 505 may output the weighted sets of digital samples to one or more adders.

Variable-bit adders 510 (e.g., first variable-bit adder 510-1 and second variable-bit adder 510-2) in beamformer 520 may be used to add the weighted sets of digital samples together to obtain a digital sample of a beam signal y. For example, to obtain a first beam signal, $y_0$, an adder may add the corresponding weighted digital samples together—e.g., $y_0 = w_{A0}x_0 + w_{A1}x_1 + w_{A2}x_2 + w_{A3}x_3$. Similarly, to obtain a second beam signal $y_1$, an adder may add the corresponding weighted digital samples together—e.g., $y_1 = w_{B0}x_0 + w_{B1}x_1 + w_{B2}x_2 + w_{B3}x_3$. And so on.

Variable-bit adders 510 may be capable of adding a single pair of operands having a first bit-width or adding multiple (e.g., two) pairs of operands having a second bit-width that is smaller than the first bit-width. For example, a variable-bit adder may be configured to support a 14-bit operation to process digital samples associated with a first signal, $S_A$:

| $S_A$ | $S_A$ | $S_A$ | $S_A$ | $S_A$ | $S_A$ | $S_A$ | $S_A$ | $S_A$ | $S_A$ | $S_A$ | $S_A$ | $S_A$ | $S_A$ |
|---|---|---|---|---|---|---|---|---|---|---|---|---|---|
| $B_0$ | $B_1$ | $B_2$ | $B_3$ | $B_4$ | $B_5$ | $B_6$ | $B_7$ | $B_8$ | $B_9$ | $B_{10}$ | $B_{11}$ | $B_{12}$ | $B_{13}$ |

Or to support two 6-bit operations to process digital samples associated with a first signal, $S_A$, and a second signal, $S_B$.

| $S_A$ | $S_A$ | $S_A$ | $S_A$ | $S_A$ | $S_A$ | $S_B$ | $S_B$ | $S_B$ | $S_B$ | $S_B$ | $S_B$ |
|---|---|---|---|---|---|---|---|---|---|---|---|
| $B_0$ | $B_1$ | $B_2$ | $B_3$ | $B_4$ | $B_5$ | $B_0$ | $B_1$ | $B_2$ | $B_3$ | $B_4$ | $B_5$ |

Accordingly, when the digital samples have the first bit-width, first variable-bit adder 510-1 may be configured to add the first set of weighted digital samples ($w_A$·x) to obtain digital samples of a first beam signal $y_0$. And second variable-bit adder 510-2 may be configured to add the second set of weighted digital samples ($w_B \cdot x$) to obtain digital samples of a second beam signal $y_1$. Alternatively, when the digital samples have the second bit-width, first variable-bit adder 510-1 may be configured to add the first set of weighted digital samples ($w_A \cdot x$) to obtain digital samples of a first beam signal $y_0$ as well as the second set of weighted digital samples ($w_B \cdot x$) to obtain digital samples of a second beam signal $y_1$. Also, second variable-bit adder 510-2 may be configured to add the third set of weighted digital samples ($w_C \cdot x$) to obtain digital samples of a third beam signal $y_2$ as well as the fourth set of weighted digital samples ($w_D \cdot x$) to obtain digital samples of a fourth beam signal $y_3$.

Beamformer 520 may be coupled with an interface that couples beamformer 520 with other components in a device. In some examples, the quantity of beams supported by beamformer 520 is based on an achievable data rate of the interface. For instance, if digital samples of an analog signal are represented using a first quantity of (e.g., 14) bits, then digital samples of a beam signal output by beamformer 520 may also include the first quantity of bits. In such cases, the quantity of beam signals output by beamformer 520 may be based on the achievable data rate of the interface, a sampling rate of a receiver, and the bit-width of the digital samples of the beam signal—e.g., the interface may be capable of communicating two beam signals. If the digital samples of the analog signal are represented using a second quantity (e.g., 6 bits) of bits (e.g., based on a reconfiguration of a signal converter), then digital samples of a beam signal output by beamformer 520 may also include the second quantity of bits. Accordingly, the interface may be capable of supporting the communication of an increased quantity of beam signals—e.g., based on the reduced bit-width of the digital samples of the beam signals.

Figure 6:
FIG. 6 shows an example set of operations for a signal converter with variable sampling range in accordance with examples described herein.
Figure 6:
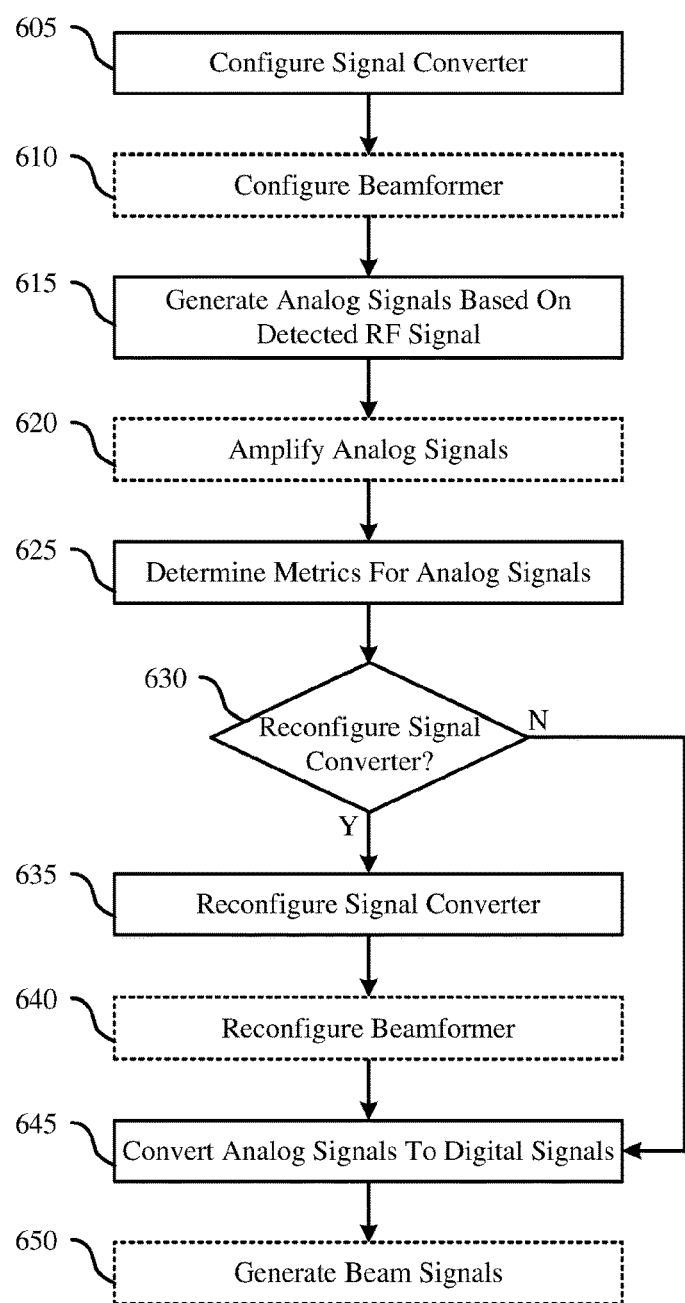

FIG. 6 illustrates an example of a set of operations for a signal converter with variable sampling range in accordance with examples as disclosed herein.

Flowchart 600 may be performed by a receiver as described herein (e.g., with reference to FIG. 2). In some examples, flowchart 600 illustrates an example set of operations performed to support a signal converter with variable sampling range. For example, flowchart 600 may include operations for adapting a sampling range of the signal converter in the receiver while maintaining a sampling resolution step size of the signal converter below a sampling resolution step size threshold.

Aspects of flowchart 600 may be implemented by a controller, among other components. Additionally, or alternatively, aspects of flowchart 600 may be implemented as instructions stored in memory (e.g., firmware stored in a memory coupled with a controller). For example, the instructions, when executed by a controller (e.g., controller 900 of FIG. 9), may cause the controller to perform the operations described in flowchart 600.

One or more of the operations described in flowchart 600 may be performed earlier or later, omitted, replaced, supplemented, or combined with another operation. Also, additional operations described herein may replace, supplement or be combined with one or more of the operations described in flowchart 600.

At 605, parameters of a signal converter (e.g., the one or more signal converters 215 of FIG. 2) may be configured. In some examples, the signal converter is configured to have a first sampling range and a first sampling resolution. The bit-width of digital samples output by the signal converter may be based on the sampling range and the sampling resolution step size configured for the signal converter. The signal converter may further be configured to have a first sampling frequency (which may correspond to a rate at which digital samples are generated by the signal converter). An output data rate of the signal converter may be based on the bit-width of the digital samples and the first sampling frequency.

In some examples, the first sampling range may be selected based on an amount of interference currently experienced by a device that includes the signal converter, an amount of interference expected to be experienced by the device, a magnitude of an analog signal output by one or more antennas of the device, or any combination thereof. In some examples, the first sampling range is a largest sampling range supported by the signal converter. For example, based on an amount of current interference being above a first threshold or based on an expected amount of interference being above a second threshold. In some examples, the first sampling range is a smallest sampling range supported by the signal converter. For example, based on an amount of current interference being below a first threshold or based on an expected amount of interference being below a second threshold.

The signal converter may include a set of comparators and a decoder as described with reference to FIG. 4A, or the signal converter may include circuitry for successive approximation as described with reference to FIG. 4B. If the signal converter is configured as described with reference to FIG. 4A, to configure a sampling range of the signal converter, different sets of the comparators may be enabled/disabled. For example, to configure the full sampling range of the signal converter, all of the sets of comparators may be enabled. The sampling resolution of the signal converter may be configured based on a quantity of the comparators that are enabled relative to the configured sampling range of the signal converter—e.g., the more comparators that are enabled, the higher the sampling resolution may be.

If the signal converter is configured as similarly described with reference to FIG. 4B, to configure a sampling range of the signal converter, a range of a digital-to-analog converter (e.g., digital-to-analog converter 425-b of FIG. 4B) may be adapted—e.g., the sampling range of the signal converter may be equivalent to the range of the digital-to-analog converter. To configure the sampling resolution of the signal converter, a quantity of approximation cycles performed within a sampling period may be adapted—e.g., the more approximation cycles performed within a sampling period, the higher the sampling resolution may be. In some examples, to maintain a constant sampling resolution independent of changes in the sampling range of the signal converter, a ratio between the sampling range and the quantity of cycles may be maintained at or below a threshold.

At 610, parameters of a beamformer (e.g., beamformer 220 of FIG. 2) may be configured. In some examples, the beamformer is configured to output a first quantity of beam signals based on the bit-width of digital samples output by the signal converter. In some examples, the beamformer is configured to output the first quantity of beam signals when the digital samples have a first bit-width and a second quantity of beam signals when the digital samples have a second bit-width. In some examples, the first quantity of beam signals is larger than the second quantity of beam signals, and the first bit-width is smaller than the second bit-width.

At 615, a set of analog signals may be generated based on a detected wireless signal. In some examples, each antenna of an antenna array (e.g., the one or more antennas 205 of FIG. 2) may output an analog signal based on the detected wireless signal.

At 620, the analog signals output by the antennas of the antenna array may be amplified (e.g., by the one or more amplifiers 210 of FIG. 2). In some examples, the amplification is a low-noise amplification. Each amplifier of the amplifiers may be coupled with one or more respective antennas of the antenna array.

At 625, metrics for the analog signals (e.g., as output by the antennas or amplifiers) may be determined. For example, a magnitude of the analog signals is determined, an amount of interference associated with the analog signals may be determined, an expected amount of interference associated with the analog signals may be determined, or any combination thereof.

Figure 7A:
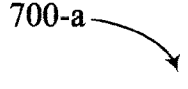
FIGS. 7A through 8B show examples of a signal diagram for a signal converter with variable sampling range in accordance with examples described herein.
Figure 7A:
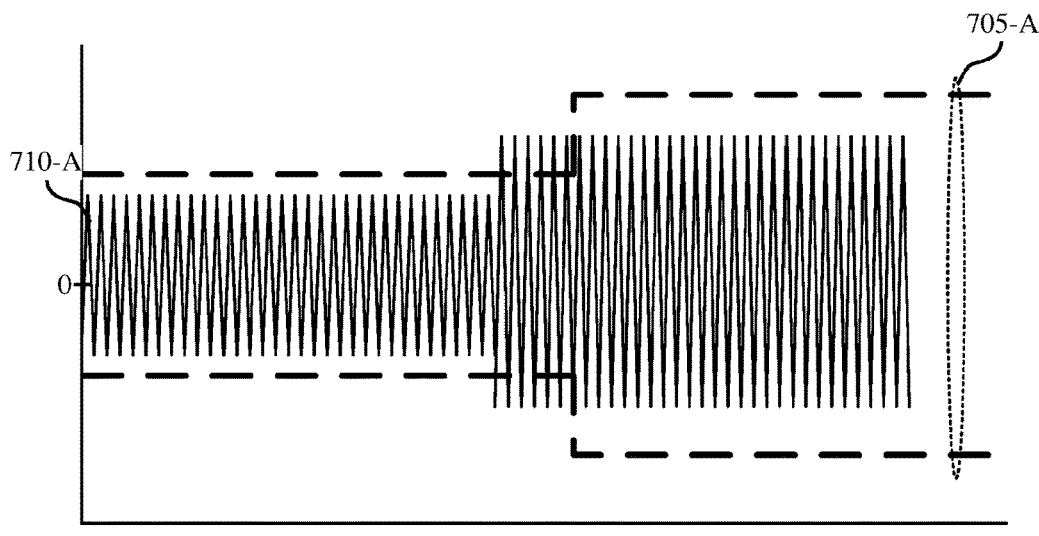

At 630, a determination of whether parameters of the signal converter should be reconfigured is made (e.g., by components within the signal converter, components external to the signal converter, or both). The determination of whether to reconfigure the signal converter may include determining whether the analog signal is causing a clipping condition at the signal converter. In some examples, it is determined that the analog signal is causing a clipping condition at the signal converter based on the extremes of the analog signal exceeding the lower limit and/or upper limit of the sampling range of the signal converter (e.g., a threshold quantity of times within an interval). In some examples, it may be determined that the analog signal is causing a clipping condition at the signal converter based on frequency characteristics of the digital signal output by the signal converter that are characteristic of a clipping condition. The analog signal 710-*a* of FIG. 7A depicts an example of an analog signal that causes a clipping condition at the signal converter, when the analog signal increases in magnitude such that the upper and lower limits of the analog signal exceed the upper and lower limits of the sampling range 705-*a* of the signal converter. In some examples, based on determining that the analog signal is causing a clipping condition, a determination to reconfigure the parameters of the signal converter may be made. Conversely, based on determining that the analog signal is not causing a clipping condition, a determination to reconfigure the parameters of the signal converter may be made.

Figure 7B:
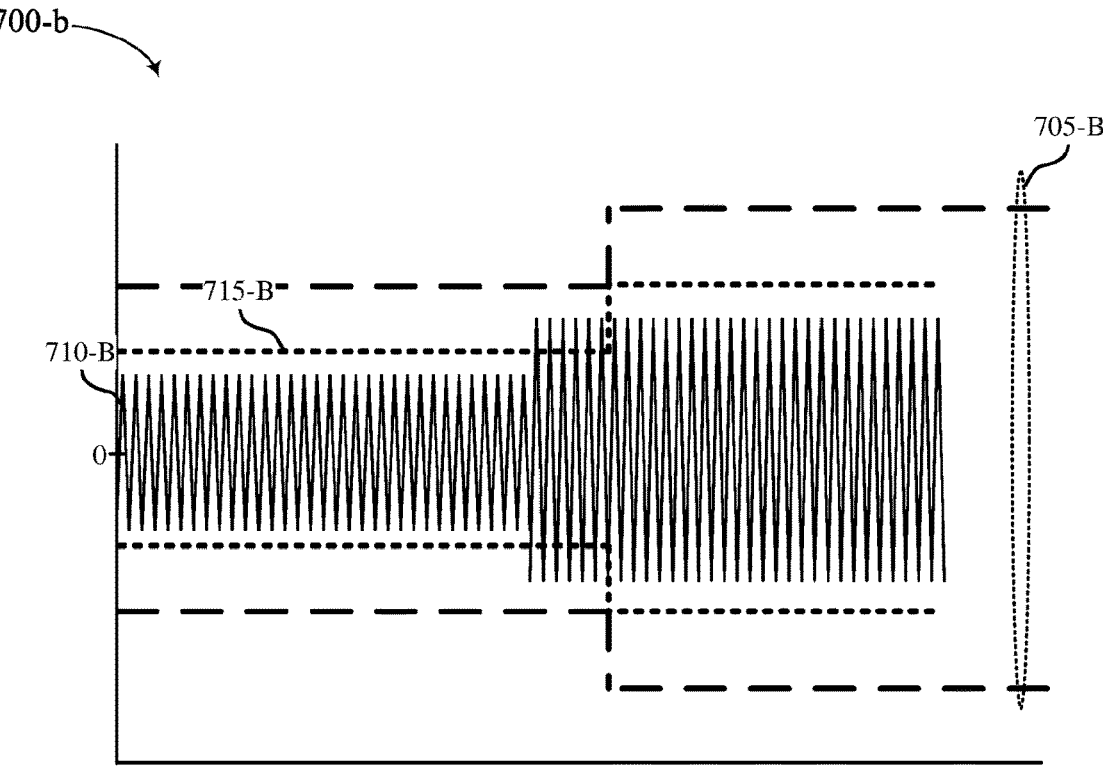

The determination of whether to reconfigure the parameters of the signal converter may include determining whether a magnitude of the analog signal is exceeding a threshold range. In some examples, it is determined that the magnitude of the analog signal is exceeding the threshold range based on the extremes of the analog signal exceeding the lower limit and/or upper limit of the threshold limit. The analog signal 710-*b* of FIG. 7B depicts an example of an analog signal that increases in magnitude such that the upper and lower limits of the analog signal exceed the upper and lower limits of the threshold range 715-*b* configured for the signal converter. In some examples, based on determining that the analog signal is exceeding a threshold range, a determination to reconfigure the parameters of the signal converter may be made. Conversely, based on determining that the analog signal is below the threshold range, a determination to reconfigure the parameters of the signal converter may be made.

The determination of whether to reconfigure the parameters of the signal converter may include determining whether an amount of interference in the analog signal is expected to exceed an interference threshold. In some examples, the amount of interference is expected to exceed the interference threshold based on a historic or expected levels of interference in a geographic area entered by a device including the signal converter, during a time-of-day, or both. Additionally, or alternatively, the amount of interference may be expected to exceed the interference threshold based on an indication that an internal or nearby transmitter is scheduled for a transmission. Additionally, or alternatively, the amount of interference may be expected to exceed the interference threshold based on predicting that another transmitter will transmit in the direction of the device. In some examples, determining that an expected level of interference exceeds a threshold, a determination to reconfigure the parameters of the signal converter may be made, and so forth. Conversely, based on determining that the expected level of interference is below a threshold, a determination to reconfigure the parameters of the signal converter may be made.

Based on determining that a reconfiguration of the parameters of the signal converter is in order, the operations described with reference to 635 may be performed. Otherwise, the operations described with reference to 645 may be performed.

At 635, parameters of the signal converter may be reconfigured. In some examples, a sampling range of the signal converter may be increased based on determining that an analog signal is causing a clipping condition at the signal converter, as depicted with reference to FIG. 7A. For example, the sampling range of the signal converter may be increased based on determining that the analog signal is causing a clipping condition for a threshold duration. Conversely, the sampling range of the signal converter may be decreased based on determining that a clipping condition has not been observed at the signal converter for a second threshold duration. The second threshold duration may be different (e.g., longer) than the first threshold duration. In some examples, the threshold durations are based on one or more factors, including a geographic area of the signal converter, a time-of-day, historical interference, etc.

In some examples, a sampling range of the signal converter may be increased based on determining that an analog signal is exceeding a first threshold level, as depicted with reference to FIG. 7B—e.g., for the threshold duration. A threshold level monitored by the signal converter may also be increased to a second threshold level based on increasing the sampling range of the signal converter. If the analog signal exceeds the second threshold level, the sampling range of the signal converter may be similarly increased. In some examples, the magnitude of the analog signal may continue to be compared with the first threshold level, the second threshold level, or both. In such cases, if the magnitude of the analog signal falls below the first or second threshold level (e.g., for the second threshold duration), the sampling range of the signal converter may be decreased.

In some examples, a sampling range of a signal converter may be increased based on determining that an expected amount of interference for the analog signal exceeds a threshold. Conversely, the sampling range of the signal converter may be decreased based on determining that the expected amount of interference is at or below the threshold.

Based on adapting the sampling range of the signal converter, components of the signal converter may also be adapted—e.g., to maintain a sampling resolution step size of the signal converter at a same level, below a sampling resolution step size threshold, or both. For example, if the sampling range of the signal converter is increased, a quantity of comparators used to process the analog signal may be increased, as described with reference to FIG. 4A. Additionally, a decoder may be configured to process the signals output by the newly enabled comparators and to output digital samples with an increased bit-width. Alternatively, if the sampling range of the signal converter is decreased, a quantity of comparators used to process the analog signal may be decreased, as described with reference to FIG. 4A. Additionally, the decoder may be configured to ignore the signals output by the newly disabled comparators and to output digital samples with a decreased bit-width.

In another example, if the sampling range of the signal converter is increased, a quantity of approximation cycles used to process the analog signal may be increased, as described with reference to FIG. 4B. Alternatively, if the sampling range of the signal converter is decreased, a quantity of approximation cycles used to process the analog signal may be decreased, as also described with reference to FIG. 4B.

Accordingly, a bit-width of digital samples output by the signal converter may change as the parameters (e.g., the sampling range and sampling resolution step size) of the signal converter are adapted. For example, the bit-width of the digital samples may increase when the sampling range is increased and decrease when the sampling range is decreased. In some examples, an indication that the signal converter has been reconfigured (and thus that the bit-width of digital samples has been adapted) may be provided to additional components within the device, including a beamformer, a processor, or both.

In some examples, if the bit-width of the digital samples are decreased, a sampling frequency of the signal converter (and a throughput of data through a device) may be increased. Alternatively, if the bit-width of the digital samples are increased, a sampling frequency of the signal converter (and a throughput of data through a device) may be decreased.

At 640, parameters of the beamformer may be reconfigured—e.g., based on the parameters of the signal converter being reconfigured. In some examples, the beamformer may be reconfigured to support generating a second quantity of beam signals based on the bit-widths of digital samples output by the reconfigured signal converter. To support generating different quantity of beam signals, arithmetic components (e.g., adders and/or multipliers) within the beamformer may be reconfigured to support digital samples of larger or smaller bit-widths.

In some examples, based on the bit-width of the digital samples output by the signal converter increasing, the beamformer may be reconfigured to generate a smaller quantity of beam signals (e.g., two beam signals). For example, the beamformer may apply two beam weights to incoming digital signals (e.g., instead of four) and may output the first weighted signal to a first adder (which may be fully utilized by the bit-width of the digital signals) and the second weighted signal to a second adder (which may also be fully utilized by the bit-width of the digital signals). The first adder may be an example of first variable-bit adder 510-1 of FIG. 5 and the second adder may be an example of second variable-bit adder 510-2 of FIG. 5.

In some examples, based on the bit-width of the digital samples output by the signal converter decreasing, the beamformer may be reconfigured to generate a same or greater quantity of beam signals (e.g., four beam signals). In some examples, a quantity of beams output by the beamformer may be maintained if the sampling frequency of a signal converter is increased based on reconfiguring the signal converter—e.g., if increasing the sampling frequency and quantity of beams would exceed a capacity of an interface.

At 645, the analog signals (as output by the antennas or processed by the amplifiers) may be converted to digital signals—e.g., by the signal converter. As described herein, the digital signal may include a stream of digital samples, where a bit-width of the digital samples may be based on a configured sampling range and sampling resolution step size of the signal converter. In some examples, the digital signals correspond to analog signals generated by one or more antennas of an antenna array.

At 650, beam signals may be generated from the digital signals—e.g., by the beamformer. As described herein, to generate the beam signals, the beamformer may apply beam weights to the digital signals, where the quantity of beam weights applied to the digital signals may be based on a bit-width of the digital samples in the digital signals. Generating the beam signals may include multiplying the digital samples by respective beam coefficients of respective beam weights and adding the respective weighted digital samples together.

FIG. 7A illustrates a signal diagram 700-$a$ for a signal converter with variable sampling range in accordance with examples as disclosed herein. Signal diagram 700-$a$ may depict analog signal 710-$a$ with reference to a sampling range 705-$a$ of a signal converter. As described with reference to the operations described at 630 of FIG. 6, signal diagram 700-$a$ may further depict the extremes of analog signal 710-$a$ exceeding the sampling range 705-$a$ of the signal converter, resulting in a clipping condition at the signal converter—e.g., as the extremes of the analog signal may be outside of a detectable range of the signal converter. As further described with reference to the operations described at 635 of FIG. 6, signal diagram 700-$a$ may depict the increase of the sampling range 705-$a$ of the signal converter in response to the detection of the clipping condition. In some examples, for illustrative purposes, the analog signal 710-$a$ and sampling range 705-$a$ of the signal converter depicted in FIG. 7A may be normalized around a zeroed axis—e.g., despite having a DC offset.

FIG. 7B illustrates a signal diagram 700-$b$ for a signal converter with variable sampling range in accordance with examples as disclosed herein. Signal diagram 700-$b$ may depict analog signal 710-$b$ with reference to a sampling range 705-$b$ of a signal converter and a threshold range 715-$b$. As described with reference to the operations described at 630 of FIG. 6, signal diagram 700-$b$ may further depict the extremes of analog signal 710-$b$ exceeding the threshold range 715-$b$ configured for the signal converter. As further described with reference to operations 635 FIG. 6, signal diagram 700-$b$ may depict the increase of the sampling range 705-$b$ of the signal converter in response to the detection of the threshold range 715-$b$ being exceeded as well as the increase of the threshold range 715-$b$. In some examples, for illustrative purposes, the analog signal 710-$a$ and sampling range 705-$a$ of the signal converter depicted in FIG. 7A may be normalized around a zeroed axis—e.g., despite having a DC offset.

Figure 8A:
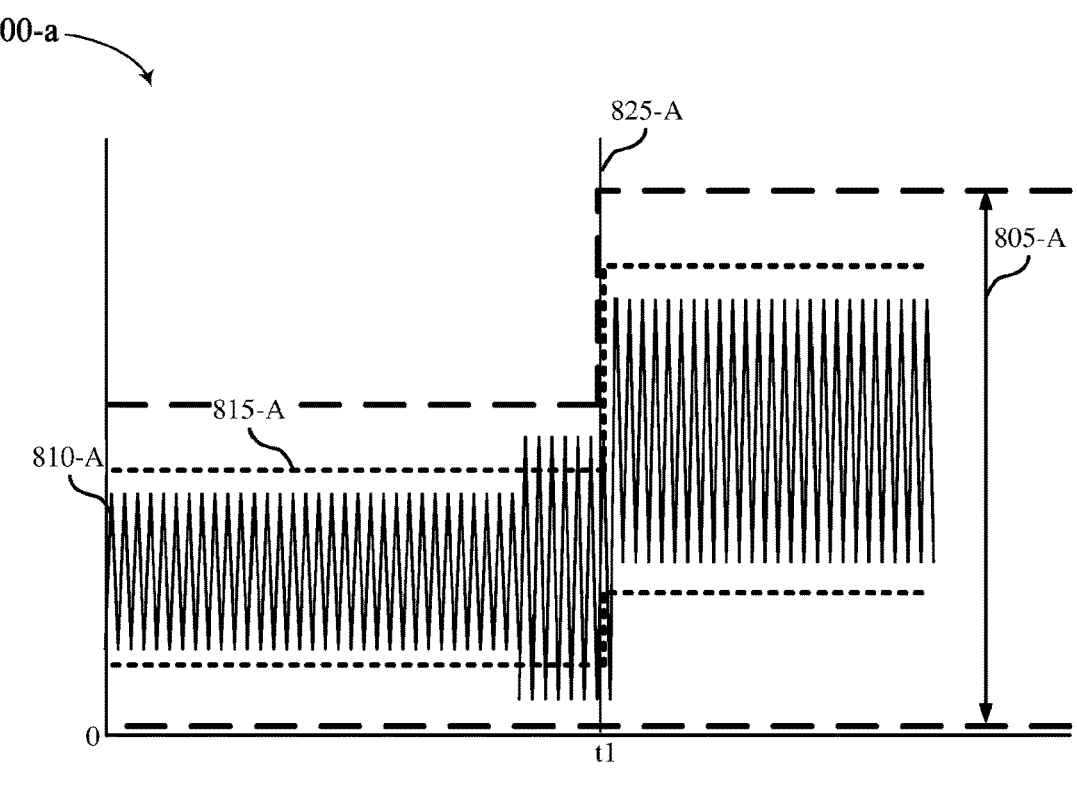

FIG. 8A illustrates a signal diagram 800-$a$ for a signal converter with variable sampling range in accordance with examples as disclosed herein. Signal diagram 800-$a$ may depict analog signal 810-$a$ without normalization about a zeroed axis. As depicted in signal diagram 800-$a$, when the sampling range 805-$a$ of the signal converter is increased at time t1 825-$a$, analog signal 810-$a$ may no longer be centered between the lower limit and upper limit of the sampling range 805-*a* of the signal converter—e.g., based on a threshold voltage for determining a least significant bit having a fixed voltage. In some examples, signal diagram 800-*a* may depict an operation of a signal converter configured in accordance with FIG. 3A or 4A.

Accordingly, a DC offset may be added to analog signal 810-*a* such that analog signal 810-*a* is centered between the lower limit and upper limit of the sampling range 805-*a* of the signal converter after the sampling range 805-*a* of the signal converter is adapted at time t1 825-*a*. The DC offset may similarly be applied to threshold limit 815-*a* such that analog signal 810-*a* is centered between the upper and lower limits of threshold limit 815-*a*. Threshold limit 815-*a* may include one or more threshold limits, with a first threshold limit shown prior to time t1 825-*a* and a second threshold limit shown subsequent to time t1 825-*a*. The sampling range 805-*a* of the signal converter may be decreased if the analog signal 810-*a* is no longer above the first threshold limit (e.g., for a certain period of time). The sampling range 805-*a* of the signal converter may be increased if the analog signal 810-*a* is above the second threshold limit (e.g., for a certain period of time).

Figure 8B:
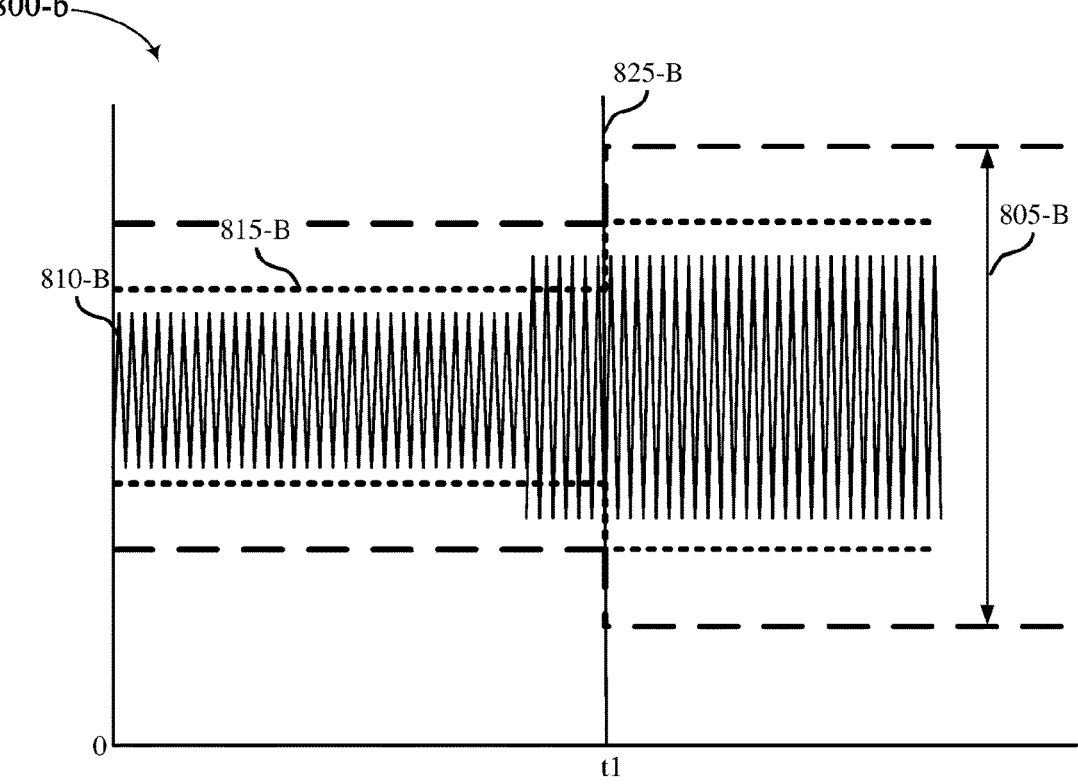

FIG. 8B illustrates a signal diagram 800-*b* for a signal converter with variable sampling range in accordance with examples as disclosed herein. Signal diagram 800-*b* may depict analog signal 810-*b* without normalization about a zeroed axis. As depicted in signal diagram 800-*b*, when the sampling range 805-*b* of the signal converter is increased at time t1 825-*b*, analog signal 810-*b* may remain centered between the lower limit and upper limit of the sampling range 805-*b* of the signal converter—e.g., based on a threshold voltage for determining a least significant bit having a variable voltage. Threshold limit 815-*b* may include one or more threshold limits, with a first threshold limit shown prior to time t1 825-*b* and a second threshold limit shown subsequent to time t1 825-*b*. The sampling range 805-*b* of the signal converter may be decreased if the analog signal 810-*b* is no longer above the first threshold limit (e.g., for a certain period of time). The sampling range 805-*b* of the signal converter may be increased if the analog signal 810-*b* is above the second threshold limit (e.g., for a certain period of time). In some examples, signal diagram 800-*b* may depict an operation of a signal converter configured in accordance with FIG. 3B.

Figure 9:
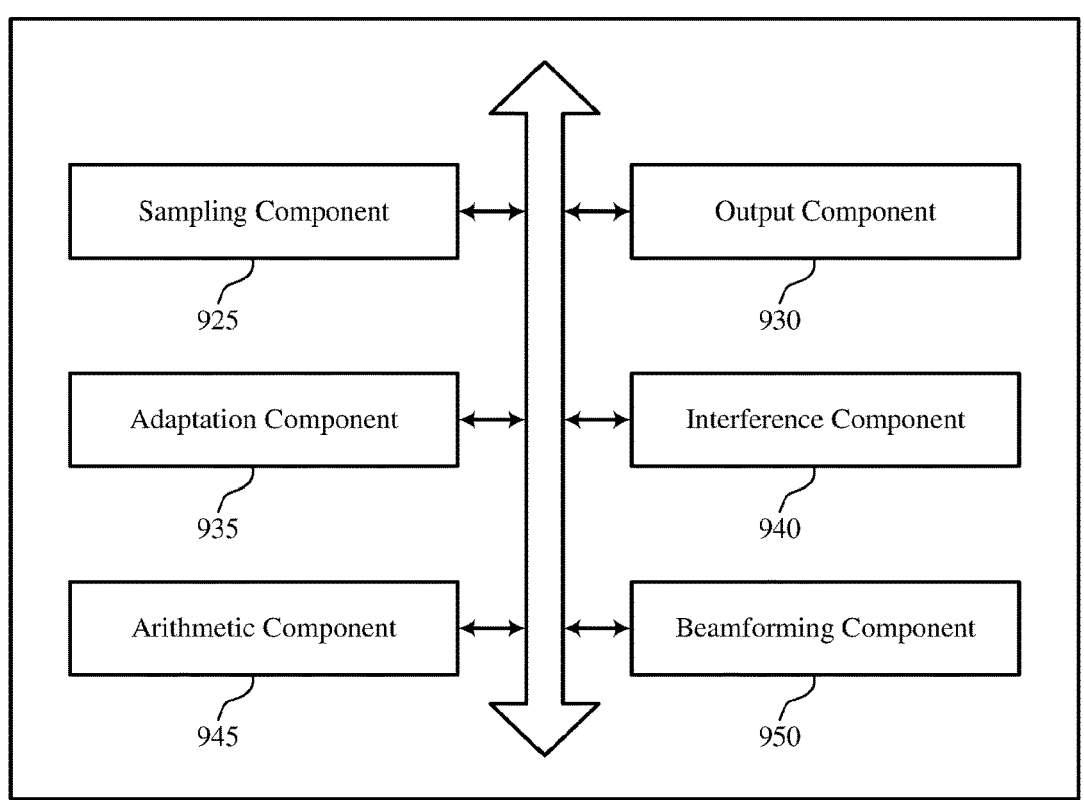
FIG. 9 shows an example controller that supports a signal converter with variable sampling range in accordance with examples described herein.

FIG. 9 shows an example controller 900 that supports a signal converter with variable sampling range in accordance with examples described herein.

Controller 900 may be an example of aspects of a communications device as described with reference to FIGS. 1 through 8. Controller 900, or various components thereof, may be an example of means for performing various aspects of the signal converter with variable dynamic range as described herein. For example, controller 900 may include sampling component 925, output component 930, adaptation component 935, interference component 940, arithmetic component 945, beamforming component 950, or any combination thereof. Each of these components may communicate, directly or indirectly, with one another (e.g., via one or more buses).

In some examples, the controller 900, or components thereof may be implemented in hardware (e.g., in communications management circuitry). The hardware may include a processor, a DSP, an ASIC, an FPGA or other programmable logic device, a discrete gate or transistor logic, discrete hardware components, or any combination thereof configured as or otherwise supporting a means for performing the functions described in the present disclosure. In some examples, a processor and memory coupled with the processor may be configured to perform one or more of the functions described herein (e.g., by executing, by the processor, instructions stored in the memory).

Additionally, or alternatively, in some examples, the controller 900, or components thereof, may be implemented in code (e.g., as communications management software or firmware) executed by a processor. If implemented in code executed by a processor, the functions of the controller 900 or components thereof may be performed by a general-purpose processor, a DSP, a CPU, an ASIC, an FPGA, or any combination of these or other programmable logic devices (e.g., configured as or otherwise supporting a means for performing the functions described in the present disclosure).

Controller 900 may support communications at a device in accordance with examples as disclosed herein. In some examples, controller 900 may perform operations that may otherwise be performed by a component of receiver 200 of FIG. 2, operations for communicating information that may otherwise be communicated between components of receiver 200, or both. For example, controller 900 may be used to detect interference metrics associated with receiver 200. That is, controller 900 may be used to compare a magnitude of a signal input to the one or more signal converters 215 of FIG. 2 with a threshold stored at controller 900. Also, controller 900 may be used to detect a clipping condition at the one or more signal converters 215—e.g., based on monitoring an output of the one or more signal converters 215. In some examples, controller 900 may be used to convey signaling to other components of receiver 200 to related components of receiver 200. For example, controller 900 may be configured to indicate to beamformer 200 when an interference metric measured at the one or more signal converters 215 exceeds a threshold.

In some examples, controller 900 transmits signaling that reconfigures a mode of a component of receiver 200. For example, controller 900 may configure the one or more signal converters 215 to use a higher dynamic range based on determining that an interference metric exceeds a threshold. Based on configuring the higher dynamic range at the one or more signal converters 215, the controller may indicate to beamformer 220 of FIG. 2 to reduce a quantity of beam signals generated at beamformer 220. Alternatively, controller 900 may configure the one or more signal converters 215 to use a lower dynamic range based on determining that an interference metric is below a threshold and configure beamformer 220 to increase a quantity of generated beam signals.

Sampling component 925 may be configured as or otherwise support a means for sampling, during a first time period, a first analog signal in accordance with a first sampling range and a sampling resolution step size over the first sampling range. Output component 930 may be configured as or otherwise support a means for outputting, during the first time period, a first digital sequence based at least in part on sampling the first analog signal during the first time period. In some examples, outputting the first digital sequence includes outputting a first plurality of samples. In some examples, each sample of the first plurality of samples has a first bit-width based at least in part on the first sampling range having a first width, and outputting the second digital sequence includes outputting a second plurality of samples. In some examples, each sample of the second plurality of samples has a second bit-width based at least in part on the second sampling range having a second width. In some examples, the first bit-width is less than the second bit-width.

Adaptation component 935 may be configured as or otherwise support a means for adapting, based at least in part on a metric of interference associated with the device, the first sampling range to a second sampling range while maintaining the sampling resolution step size over the second sampling range. In some examples, sampling component 925 may be configured as or otherwise support a means for sampling, during a second time period, a second analog signal in accordance with the second sampling range. In some examples, output component 930 may be configured as or otherwise support a means for outputting, during the second time period and based at least in part on the sampling, a second digital sequence based at least in part on the second analog signal.

In some examples, interference component 940 may be configured as or otherwise support a means for comparing, during the first time period, a magnitude of the first analog signal with a threshold. In some examples, interference component 940 may be configured as or otherwise support a means for determining, based at least in part on the magnitude of the first analog signal satisfying the threshold, that a level of interference at the device satisfies an interference threshold, where the first sampling range is adapted based at least in part on the level of interference satisfying the interference threshold.

In some examples, interference component 940 may be configured as or otherwise support a means for detecting, during the first time period, that an output of a signal converter for sampling the first analog signal is being clipped. In some examples, interference component 940 may be configured as or otherwise support a means for determining, based at least in part on the output of the signal converter being clipped, that a level of interference at the device satisfies the interference threshold, where the first sampling range is adapted based at least in part on the level of interference satisfying the interference threshold.

In some examples, interference component 940 may be configured as or otherwise support a means for determining that a predicted level of interference at the device during the second time period satisfies an interference threshold, where the first sampling range is adapted based at least in part on the predicted level of interference satisfying the interference threshold.

In some examples, to support determining that the predicted level of interference satisfies the interference threshold, interference component 940 may be configured as or otherwise support a means for determining a presence of the device within a geographic region that is associated with interference levels that exceed the interference threshold. In some examples, to support determining that the predicted level of interference satisfies the interference threshold, interference component 940 may be configured as or otherwise support a means for determining that a period of a day that is associated with interference levels that exceed the interference threshold has been entered. In some examples, to support determining that the predicted level of interference satisfies the interference threshold, interference component 940 may be configured as or otherwise support a means for determining that an internal transmitter is scheduled for transmissions during the second time period. In some examples, to support determining that the predicted level of interference satisfies the interference threshold, interference component 940 may be configured as or otherwise support a means for receiving, from a neighboring device, an indication that the neighboring device is scheduled for transmissions during the second time period. In some examples, to support determining that the predicted level of interference satisfies the interference threshold, interference component 940 may be configured as or otherwise support a means for predicting that interfering signals from other transmitters will be incoming during the second time period.

In some examples, sampling component 925 may be configured as or otherwise support a means for sampling, during the first time period, the first analog signal with a first sampling frequency to obtain the first plurality of samples, where sampling the second analog signal during the second time period includes sampling the second analog signal with a second sampling frequency to obtain the second plurality of samples, where the first sampling frequency is greater than the second sampling frequency based at least in part on the first bit-width being less than the second bit-width.

In some examples, the first sampling frequency and the second sampling frequency are based at least in part on an achievable data rate of an interface for communicating the first digital sequence and the second digital sequence and respective bit-widths of the first plurality of samples and the second plurality of samples.

In some examples, beamforming component 950 may be configured as or otherwise support a means for generating, during the first time period, a plurality of first beam signals from the first digital sequence based at least in part on the first plurality of samples having the first bit-width. In some examples, beamforming component 950 may be configured as or otherwise support a means for generating, during the second time period, a plurality of second beam signals from the second digital sequence based at least in part on the second plurality of samples having the second bit-width, where a quantity of the plurality of first beam signals is greater than a quantity of the plurality of second beam signals.

In some examples, the quantity of the plurality of first beam signals and the quantity of the plurality of second beam signals is based at least in part on a processing capability of a beamformer and respective bit-widths of the first plurality of samples and the second plurality of samples.

In some examples, generating the plurality of first beam signals includes inputting a first portion of the first plurality of samples to a first portion of an adder of a beamformer and a second portion of the first plurality of samples to a second portion of the adder of the beamformer, the first portion of the adder being associated with a first communication signal and the second portion of the adder being associated with a second communication signal, and generating the plurality of second beam signals includes inputting the second plurality of samples to the first portion of the adder and the second portion of the adder, the adder being associated with the first communication signal.

In some examples, the first analog signal is sampled by a signal converter that includes a first element for detecting signals within a first voltage range and a second element for detecting signals within a second voltage range that is greater than the first voltage range, and arithmetic component 945 may be configured as or otherwise support a means for disabling the second element based at least in part on the first analog signal being within the first voltage range, where a first plurality of samples having a first bit-width is obtained during the first time period by the signal converter based at least in part on the second element being disabled, the first digital sequence including the first plurality of samples, where adapting the first sampling range to the second sampling range includes enabling the second element based at least in part on the second analog signal being within the second voltage range, where a second plurality of samples having a second bit-width is obtained during the second time period by the signal converter based at least in part on the first element and the second element being enabled, the second digital sequence including the second plurality of samples.

In some examples, the first analog signal is sampled by the signal converter that includes a first element for detecting signals within a first voltage range, and arithmetic component 945 may be configured as or otherwise support a means for disabling the second element and the third element based at least in part on the first analog signal being within the first voltage range, where a first plurality of samples having a first bit-width is obtained during the first time period by the signal converter based at least in part on the second element and the third element being disabled, the first digital sequence including the first plurality of samples, where adapting the first sampling range to the second sampling range includes enabling the second element and the third element based at least in part on the second analog signal being within the third voltage range, where a second plurality of samples having a second bit-width is obtained during the second time period by the signal converter based at least in part on the second element being enabled, the second digital sequence including the second plurality of samples.

In some examples, the first analog signal and the second analog signal are sampled by the signal converter that includes a first element for sampling signals within a first voltage range and a second element for sampling signals within a second voltage range that is greater than the first voltage range, and interference component 940 may be configured as or otherwise support a means for determining that interference in an area is below an interference threshold. In some examples, the first analog signal and the second analog signal are sampled by the signal converter that includes a first element for sampling signals within a first voltage range and a second element for sampling signals within a second voltage range that is greater than the first voltage range, and adaptation component 935 may be configured as or otherwise support a means for adapting the second sampling range to the first sampling range based at least in part on the interference being below the interference threshold, where adapting the second sampling range to the first sampling range includes disabling the second element.

In some examples, the first analog signal and the second analog signal are sampled by the signal converter that includes a first element for sampling signals within a first voltage range and a second element for sampling signals within a second voltage range that is greater than the first voltage range, and interference component 940 may be configured as or otherwise support a means for determining that interference is above an interference threshold in an area, where adapting the first sampling range to the second sampling range includes enabling the second element based at least in part on the interference being above the interference threshold.

In some examples, the first element includes a first set of comparators and the second element includes a second set of comparators.

In some examples, the first analog signal and the second analog signal are sampled by the signal converter that includes a successive approximation circuit, and interference component 940 may be configured as or otherwise support a means for determining that interference in an area is above an interference threshold, where adapting the first sampling range to the second sampling range includes increasing a quantity of approximation cycles applied by the successive approximation circuit to an analog sample based at least in part on the interference being above the interference threshold.

In some examples, the first analog signal includes a first portion of an analog signal, and the second analog signal includes a second portion of the analog signal.

FIG. 10 shows an example set of operations for a signal converter with variable sampling range in accordance with examples described herein.

Flowchart 1000 may be implemented by a communications device or its components as described herein. For example, the operations of flowchart 1000 may be performed by a communications device as described with reference to FIGS. 1 through 9. In some examples, a communications device may execute a set of instructions to control the functional elements of the device to perform the described functions. Additionally, or alternatively, the communications device may perform aspects of the described functions using special-purpose hardware.

At 1005, the set of operations may include sampling, during a first time period, a first analog signal in accordance with a first sampling range and a sampling resolution step size over the first sampling range. The operations of 1005 may be performed in accordance with examples as disclosed herein. In some examples, aspects of the operations of 1005 may be performed by a sampling component 925 as described with reference to FIG. 9.

At 1010, the set of operations may include outputting, during the first time period, a first digital sequence based at least in part on sampling the first analog signal during the first time period. The operations of 1010 may be performed in accordance with examples as disclosed herein. In some examples, aspects of the operations of 1010 may be performed by an output component 930 as described with reference to FIG. 9.

At 1015, the set of operations may include adapting, based at least in part on a metric of interference associated with the device, the first sampling range to a second sampling range while maintaining the sampling resolution step size over the second sampling range. The operations of 1015 may be performed in accordance with examples as disclosed herein. In some examples, aspects of the operations of 1015 may be performed by an adaptation component 935 as described with reference to FIG. 9.

At 1020, the set of operations may include sampling, during a second time period, a second analog signal in accordance with the second sampling range. The operations of 1020 may be performed in accordance with examples as disclosed herein. In some examples, aspects of the operations of 1020 may be performed by a sampling component 925 as described with reference to FIG. 9.

At 1025, the set of operations may include outputting, during the second time period and based at least in part on the sampling, a second digital sequence based at least in part on the second analog signal. The operations of 1025 may be performed in accordance with examples as disclosed herein. In some examples, aspects of the operations of 1025 may be performed by an output component 930 as described with reference to FIG. 9.

In some examples, an apparatus as described herein may perform a method or methods, such as the method described in flowchart 1000. The apparatus may include features, circuitry, logic, means, or instructions (e.g., a non-transitory computer-readable medium storing instructions executable by a processor), or any combination thereof for performing the following aspects of the present disclosure:

Aspect 1: A method, apparatus, or non-transitory computer-readable medium including operations, features, circuitry, logic, means, or instructions, or any combination thereof for sampling, during a first time period, a first analog signal in accordance with a first sampling range and a sampling resolution steps size over the first sampling range; outputting, during the first time period, a first digital sequence based at least in part on sampling the first analog signal during the first time period; adapting, based at least in part on a metric of interference associated with the device, the first sampling range to a second sampling range while maintaining the sampling resolution step size below a sampling resolution step size threshold over the second sampling range; sampling, during a second time period, a second analog signal in accordance with the second sampling range; and outputting, during the second time period and based at least in part on the sampling, a second digital sequence based at least in part on the second analog signal.

Aspect 2: The method, apparatus, or non-transitory computer-readable medium of aspect 1, further including operations, features, circuitry, logic, means, or instructions, or any combination thereof for comparing, during the first time period, a magnitude of the first analog signal with a threshold and determining, based at least in part on the magnitude of the first analog signal satisfying the threshold, that a level of interference at the device satisfies an interference threshold, where the first sampling range is adapted based at least in part on the level of interference satisfying the interference threshold.

Aspect 3: The method, apparatus, or non-transitory computer-readable medium of any of aspects 1 through 2, further including operations, features, circuitry, logic, means, or instructions, or any combination thereof for detecting, during the first time period, that an output of a signal converter for sampling the first analog signal is being clipped and determining, based at least in part on the output of the signal converter being clipped, that a level of interference at the device satisfies an interference threshold, where the first sampling range is adapted based at least in part on the level of interference satisfying the interference threshold.

Aspect 4: The method, apparatus, or non-transitory computer-readable medium of any of aspects 1 through 3, further including operations, features, circuitry, logic, means, or instructions, or any combination thereof for determining that a predicted level of interference at the device during the second time period satisfies an interference threshold, where the first sampling range is adapted based at least in part on the predicted level of interference satisfying the interference threshold.

Aspect 5: The method, apparatus, or non-transitory computer-readable medium of aspect 4 where determining that the predicted level of interference satisfies the interference threshold includes operations, features, circuitry, logic, means, or instructions, or any combination thereof for determining a presence of the device within a geographic region that is associated with interference levels that exceed the interference threshold; determining that a period of a day that is associated with interference levels that exceed the interference threshold has been entered; determining that an internal transmitter is scheduled for transmissions during the second time period; receiving, from a neighboring device, an indication that the neighboring device is scheduled for transmissions during the second time period; and predicting that interfering signals from other transmitters will be incoming during the second time period.

Aspect 6: The method, apparatus, or non-transitory computer-readable medium of any of aspects 1 through 5 where outputting the first digital sequence includes outputting a first plurality of samples; each sample of the first plurality of samples has a first bit-width based at least in part on the first sampling range having a first width, and outputting the second digital sequence includes outputting a second plurality of samples; each sample of the second plurality of samples has a second bit-width based at least in part on the second sampling range having a second width; and the first bit-width is less than the second bit-width.

Aspect 7: The method, apparatus, or non-transitory computer-readable medium of aspect 6, further including operations, features, circuitry, logic, means, or instructions, or any combination thereof for sampling, during the first time period, the first analog signal with a first sampling frequency to obtain the first plurality of samples, where sampling the second analog signal during the second time period includes sampling the second analog signal with a second sampling frequency to obtain the second plurality of samples, where the first sampling frequency is greater than the second sampling frequency based at least in part on the first bit-width being less than the second bit-width.

Aspect 8: The method, apparatus, or non-transitory computer-readable medium of aspect 7 where the first sampling frequency and the second sampling frequency are based at least in part on an achievable data rate of an interface for communicating the first digital sequence and the second digital sequence and respective bit-widths of the first plurality of samples and the second plurality of samples.

Aspect 9: The method, apparatus, or non-transitory computer-readable medium of any of aspects 6 through 8, further including operations, features, circuitry, logic, means, or instructions, or any combination thereof for generating, during the first time period, a plurality of first beam signals from the first digital sequence based at least in part on the first plurality of samples having the first bit-width and generating, during the second time period, a plurality of second beam signals from the second digital sequence based at least in part on the second plurality of samples having the second bit-width, where a quantity of the plurality of first beam signals is greater than a quantity of the plurality of second beam signals.

Aspect 10: The method, apparatus, or non-transitory computer-readable medium of aspect 9 where the quantity of the plurality of first beam signals and the quantity of the plurality of second beam signals is based at least in part on a processing capability of a beamformer and respective bit-widths of the first plurality of samples and the second plurality of samples.

Aspect 11: The method, apparatus, or non-transitory computer-readable medium of any of aspects 9 through 10 where generating the plurality of first beam signals includes inputting a first portion of the first plurality of samples to a first portion of an adder of a beamformer and a second portion of the first plurality of samples to a second portion of the adder of the beamformer, the first portion of the adder being associated with a first communication signal and the second portion of the adder being associated with a second communication signal, and generating the plurality of second beam signals includes inputting the second plurality of samples to the first portion of the adder and the second portion of the adder, the adder being associated with the first communication signal.

Aspect 12: The method, apparatus, or non-transitory computer-readable medium of any of aspects 1 through 11 where the first analog signal is sampled by a signal converter that includes a first element for detecting signals within a first voltage range and a second element for detecting signals within a second voltage range that is greater than the first voltage range and the method, apparatuses, and non-transitory computer-readable medium, further includes operations, features, circuitry, logic, means, or instructions, or any combination thereof for disabling the second element based at least in part on the first analog signal being within the first voltage range, where a first plurality of samples having a first bit-width is obtained during the first time period by the signal converter based at least in part on the second element being disabled, the first digital sequence including the first plurality of samples, where adapting the first sampling range to the second sampling range includes enabling the second element based at least in part on the second analog signal being within the second voltage range, where a second plurality of samples having a second bit-width is obtained during the second time period by the signal converter based at least in part on the first element and the second element being enabled, the second digital sequence including the second plurality of samples.

Aspect 13: The method, apparatus, or non-transitory computer-readable medium of any of aspects 1 through 12 where the first analog signal is sampled by a signal converter that includes a first element for detecting signals within a first voltage range and the method, apparatuses, and non-transitory computer-readable medium, further includes operations, features, circuitry, logic, means, or instructions, or any combination thereof for disabling the second element and the third element based at least in part on the first analog signal being within the first voltage range, where a first plurality of samples having a first bit-width is obtained during the first time period by the signal converter based at least in part on the second element and the third element being disabled, the first digital sequence including the first plurality of samples, where adapting the first sampling range to the second sampling range includes enabling the second element and the third element based at least in part on the second analog signal being within the third voltage range, where a second plurality of samples having a second bit-width is obtained during the second time period by the signal converter based at least in part on the second element being enabled, the second digital sequence including the second plurality of samples.

Aspect 14: The method, apparatus, or non-transitory computer-readable medium of any of aspects 1 through 13 where the first analog signal and the second analog signal are sampled by a signal converter that includes a first element for sampling signals within a first voltage range and a second element for sampling signals within a second voltage range that is greater than the first voltage range and the method, apparatuses, and non-transitory computer-readable medium, further includes operations, features, circuitry, logic, means, or instructions, or any combination thereof for determining that interference in an area is below an interference threshold and adapting the second sampling range to the first sampling range based at least in part on the interference being below the interference threshold, where adapting the second sampling range to the first sampling range includes disabling the second element.

Aspect 15: The method, apparatus, or non-transitory computer-readable medium of any of aspects 1 through 14 where the first analog signal and the second analog signal are sampled by a signal converter that includes a first element for sampling signals within a first voltage range and a second element for sampling signals within a second voltage range that is greater than the first voltage range and the method, apparatuses, and non-transitory computer-readable medium, further includes operations, features, circuitry, logic, means, or instructions, or any combination thereof for determining that interference is above an interference threshold in an area, where adapting the first sampling range to the second sampling range includes enabling the second element based at least in part on the interference being above the interference threshold.

Aspect 16: The method, apparatus, or non-transitory computer-readable medium of aspect 15 where the first element includes a first set of comparators and the second element includes a second set of comparators.

Aspect 17: The method, apparatus, or non-transitory computer-readable medium of any of aspects 1 through 16 where the first analog signal and the second analog signal are sampled by a signal converter that includes a successive approximation circuit and the method, apparatuses, and non-transitory computer-readable medium, further includes operations, features, circuitry, logic, means, or instructions, or any combination thereof for determining that interference in an area is above an interference threshold, where adapting the first sampling range to the second sampling range includes increasing a quantity of approximation cycles applied by the successive approximation circuit to an analog sample based at least in part on the interference being above the interference threshold.

Aspect 18: The method, apparatus, or non-transitory computer-readable medium of any of aspects 1 through 17 where the first analog signal includes a first portion of an analog signal and the second analog signal includes a second portion of the analog signal.

It should be noted that the methods described herein describe possible implementations, and that the operations and the steps may be rearranged or otherwise modified and that other implementations are possible. Further, portions from two or more of the methods may be combined.

An apparatus is described. The following provides an overview of aspects of the apparatus as described herein:

Aspect 19: An apparatus for communications, including: an antenna configured to output a first analog signal and a second analog signal; and a signal converter coupled with the antenna and configured to: convert the first analog signal to a first digital sequence in accordance with a first sampling range and a sampling resolution step size, where the first sampling range of the signal converter is adaptable to a second sampling range while the sampling resolution step size of the signal converter is maintained below a sampling resolution step size threshold, and where the signal converter is further configured to adapt the first sampling range to the second sampling range for the second analog signal based at least in part on a metric of interference; and output the first digital sequence based at least in part on converting the first analog signal and a second digital sequence based at least in part on converting the second analog signal.

Aspect 20: The apparatus of aspect 19, where the signal converter is further configured to: output, a first plurality of samples taken of the first analog signal during a first time period, each sample of the first plurality of samples having a first bit-width based at least in part on the first sampling range of the signal converter having a first width; and output, a second plurality of samples taken of the second analog signal during a second time period, each sample of the second plurality of samples having a second bit-width based at least in part on the second sampling range of the signal converter having a second width, the first bit-width being less than the second bit-width.

Aspect 21: The apparatus of aspect 20, further including: an interface configured for communicating information at a data rate, where the signal converter is further configured to adapt a sampling frequency based at least in part on the data rate supported by the interface and a difference between the first bit-width and the second bit-width.

Aspect 22: The apparatus of any of aspects 20 through 21, further including: a beamformer configured to generate a first plurality of beam signals based at least in part on the first digital sequence and to generate a second plurality of beam signals based at least in part on the second digital sequence, where a first quantity of the first plurality of beam signals is different than a second quantity of the second plurality of beam signals, and where the beamformer is further configured to adapt the first plurality of beam signals to the second plurality of beam signals based at least in part on a processing capability of the beamformer and a difference between the first bit-width and the second bit-width.

Aspect 23: The apparatus of aspect 22, where the beamformer further includes an adder configured to: receive, during the first time period, a first portion of the first plurality of samples using a first portion of the adder and a second portion of the first plurality of samples using a second portion of the adder, where the first portion of the adder is associated with a first communication signal and the second portion of the adder is associated with a second communication signal; and receive, during the second time period, the second plurality of samples using the first portion of the adder and the second portion of the adder, where the adder is associated with the first communication signal.

Aspect 24: The apparatus of any of aspects 19 through 23, where the signal converter includes: a first element configured to sample signals within a first voltage range; and a second element configured to sample signals within a second voltage range that is different than the first voltage range, where logic of the second element is configured to enable an operation of the second element based at least in part on the metric of interference satisfying a threshold.

Aspect 25: The apparatus of aspect 24, where the signal converter is further configured to: sample the first analog signal to obtain a first plurality of samples when the second element is disabled, the first digital sequence including the first plurality of samples; and sample the second analog signal to obtain a second plurality of samples when the second element is enabled, the second digital sequence including the second plurality of samples, where the first plurality of samples has a first bit-width and a the second plurality of samples has a second bit-width.

Aspect 26: The apparatus of any of aspects 24 through 25, where the signal converter includes: a third element configured to sample signals within a third voltage range that is different than the second voltage range, where logic of the third element is configured to enable an operation of the third element based at least in part on the metric of interference satisfying a second threshold that is greater than the threshold.

Aspect 27: The apparatus of any of aspects 24 through 26, where the signal converter is an analog-to-digital converter.

Aspect 28: The apparatus of any of aspects 19 through 27, where the signal converter includes: a plurality of comparators configured to receive the first analog signal and the second analog signal and to compare respective versions of the first analog signal with respective reference signals; and a decoder coupled with the plurality of comparators and configured to output the first digital sequence and the second digital sequence based at least in part on an output of the plurality of comparators, where a bit-width of samples output by the decoder is based at least in part on the first sampling range of the signal converter.

Aspect 29: The apparatus of aspect 28, where, to adapt the first sampling range of the signal converter to the second sampling range, the signal converter is further configured to: disable or enable a set of comparators of the plurality of comparators; and modify, based at least in part on disabling or enabling the set of comparators, a set of reference signals provided to enabled comparators of the plurality of comparators.

Aspect 30: The apparatus of any of aspects 19 through 29, where the signal converter includes: a sample-and-hold circuit configured to receive the first analog signal and to output a third analog signal during a sampling period; a successive approximation register coupled with the sample-and-hold circuit and configured to store a digital sample; a subtractor coupled with the sample-and-hold circuit, where: a first input of the subtractor is configured to receive, during the sampling period, the third analog signal, a second input of the subtractor is configured to receive, during the sampling period, a plurality of analog representations of the digital sample stored in the successive approximation register, and the subtractor is further configured to output, during the sampling period, a plurality of analog signals based at least in part on the third analog signal and the plurality of analog representations of the digital sample; and a comparator configured to output, during the sampling period and based at least in part on the plurality of analog signals, a plurality of result signals, where the successive approximation register is further configured to update the digital sample based at least in part on the plurality of result signals, where a bit-width of the digital sample is based on a quantity of result signals of the plurality of result signals.

Aspect 31: The apparatus of aspect 30, where, to adapt the first sampling range of the signal converter to the second sampling range, the signal converter is further configured to: adapt the quantity of result signals output by the comparator during respective sampling periods.

Information and signals described herein may be represented using any of a variety of different technologies and techniques. For example, data, instructions, commands, information, signals, bits, symbols, and chips that may be referenced throughout the description may be represented by voltages, currents, electromagnetic waves, magnetic fields or particles, optical fields or particles, or any combination thereof.

The various illustrative blocks and modules described in connection with the disclosure herein may be implemented or performed with a general-purpose processor, a DSP, an ASIC, an FPGA, or other programmable logic device, discrete gate or transistor logic, discrete hardware components, or any combination thereof designed to perform the functions described herein. A general-purpose processor may be a microprocessor, but in the alternative, the processor may be any conventional processor, controller, microcontroller, or state machine. A processor may also be implemented as a combination of computing devices (e.g., a combination of a DSP and a microprocessor, multiple microprocessors, one or more microprocessors in conjunction with a DSP core, or any other such configuration).

The functions described herein may be implemented in hardware, software executed by a processor, firmware, or any combination thereof. If implemented in software executed by a processor, the functions may be stored on or transmitted over as one or more instructions or code on a computer-readable medium. Other examples and implementations are within the scope of the disclosure and appended claims. For example, due to the nature of software, functions described herein can be implemented using software executed by a processor, hardware, firmware, hardwiring, or combinations of any of these. Features implementing functions may also be physically located at various positions, including being distributed such that portions of functions are implemented at different physical locations.

Computer-readable media includes both non-transitory computer storage media and communication media including any medium that facilitates transfer of a computer program from one place to another. A non-transitory storage medium may be any available medium that can be accessed by a general purpose or special purpose computer. By way of example, and not limitation, non-transitory computer-readable media may include RAM, ROM, electrically erasable programmable read-only memory (EEPROM), flash memory, compact disk read-only memory (CDROM) or other optical disk storage, magnetic disk storage or other magnetic storage devices, or any other non-transitory medium that can be used to carry or store desired program code means in the form of instructions or data structures and that can be accessed by a general-purpose or special-purpose computer, or a general-purpose or special-purpose processor. Also, any connection is properly termed a computer-readable medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, DSL, or wireless technologies such as infrared, radio, and microwave are included in the definition of medium. Disk and disc, as used herein, include CD, laser disc, optical disc, digital versatile disc (DVD), floppy disk and Blu-ray disc where disks usually reproduce data magnetically, while discs reproduce data optically with lasers. Combinations of the above are also included within the scope of computer-readable media.

As used herein, including in the claims, "or" as used in a list of items (e.g., a list of items prefaced by a phrase such as "at least one of" or "one or more of") indicates an inclusive list such that, for example, a list of at least one of A, B, or C means A or B or C or AB or AC or BC or ABC (i.e., A and B and C). Also, as used herein, the phrase "based on" shall not be construed as a reference to a closed set of conditions. For example, an exemplary step that is described as "based on condition A" may be based on both a condition A and a condition B without departing from the scope of the present disclosure. In other words, as used herein, the phrase "based on" shall be construed in the same manner as the phrase "based at least in part on."

In the appended figures, similar components or features may have the same reference label. Further, various components of the same type may be distinguished by following the reference label by a dash and a second label that distinguishes among the similar components. If just the first reference label is used in the specification, the description is applicable to any one of the similar components having the same first reference label irrespective of the second reference label, or other subsequent reference label.

The description set forth herein, in connection with the appended drawings, describes example configurations and does not represent all the examples that may be implemented or that are within the scope of the claims. The term "exemplary" used herein means "serving as an example, instance, or illustration," and not "preferred" or "advantageous over other examples." The detailed description includes specific details for the purpose of providing an understanding of the described techniques. These techniques, however, may be practiced without these specific details. In some instances, well-known structures and devices are shown in block diagram form in order to avoid obscuring the concepts of the described examples.

The description herein is provided to enable a person skilled in the art to make or use the disclosure. Various modifications to the disclosure will be readily apparent to those skilled in the art, and the generic principles defined herein may be applied to other variations without departing from the scope of the disclosure. Thus, the disclosure is not limited to the examples and designs described herein but is to be accorded the broadest scope consistent with the principles and novel features disclosed herein.

What is claimed is:

1. A method for communications at a device, comprising:
sampling, during a first time period, a first analog signal in accordance with a first sampling range and a first sampling resolution step size over the first sampling range;
outputting, during the first time period, a first digital sequence based at least in part on sampling the first analog signal during the first time period;
adapting, based at least in part on a metric of interference associated with the device, the first sampling range to a second sampling range, wherein a second sampling resolution step size over the second sampling range changes no more than 10% from the first sampling resolution step size over the first sampling range;
sampling, during a second time period, a second analog signal in accordance with the second sampling range; and
outputting, during the second time period and based at least in part on the sampling, a second digital sequence based at least in part on the second analog signal.

2. The method of claim 1, further comprising:
comparing, during the first time period, a magnitude of the first analog signal with a threshold; and
determining, based at least in part on the magnitude of the first analog signal satisfying the threshold, that a level of interference at the device satisfies an interference threshold, wherein the metric of interference comprises the level of interference, and wherein the first sampling range is adapted based at least in part on the level of interference satisfying the interference threshold.

3. The method of claim 1, further comprising:
detecting, during the first time period, that an output of a signal converter for sampling the first analog signal is being clipped; and
determining, based at least in part on the output of the signal converter being clipped, that a level of interference at the device satisfies an interference threshold, wherein the metric of interference comprises the level of interference, and wherein the first sampling range is adapted based at least in part on the level of interference satisfying the interference threshold.

4. The method of claim 1, further comprising:
determining that a predicted level of interference at the device during the second time period satisfies an interference threshold, wherein the metric of interference comprises the predicted level of interference, and wherein the first sampling range is adapted based at least in part on the predicted level of interference satisfying the interference threshold.

5. The method of claim 4, wherein determining that the predicted level of interference satisfies the interference threshold comprises:

determining a presence of the device within a geographic region that is associated with interference levels that exceed the interference threshold;

determining that a period of a day that is associated with interference levels that exceed the interference threshold has been entered during the second time period;

determining that an internal transmitter is scheduled for transmissions during the second time period;

receiving, from a neighboring device, an indication that the neighboring device is scheduled for transmissions during the second time period; or predicting that interfering signals transmitted from other devices will be incoming during the second time period.

6. The method of claim 1, wherein:

outputting the first digital sequence comprises outputting a first plurality of samples, wherein each sample of the first plurality of samples has a first bit-width based at least in part on the first sampling range having a first width, and outputting the second digital sequence comprises outputting a second plurality of samples, wherein each sample of the second plurality of samples has a second bit-width based at least in part on the second sampling range having a second width, and wherein the first bit-width is less than the second bit-width.

7. The method of claim 6, wherein:

sampling the first analog signal during the first time period comprises sampling the first analog signal with a first sampling frequency to obtain the first plurality of samples, sampling the second analog signal during the second time period comprises sampling the second analog signal with a second sampling frequency to obtain the second plurality of samples, and the first sampling frequency is greater than the second sampling frequency based at least in part on the first bit-width being less than the second bit-width.

8. The method of claim 7, wherein the first sampling frequency and the second sampling frequency are based at least in part on an achievable data rate of an interface for communicating the first digital sequence and the second digital sequence and respective bit-widths of the first plurality of samples and the second plurality of samples.

9. The method of claim 6, further comprising:

generating, during the first time period, a plurality of first beam signals from the first digital sequence based at least in part on the first plurality of samples having the first bit-width; and generating, during the second time period, a plurality of second beam signals from the second digital sequence based at least in part on the second plurality of samples having the second bit-width, wherein a quantity of the plurality of first beam signals is greater than a quantity of the plurality of second beam signals.

10. The method of claim 9, wherein the quantity of the plurality of first beam signals and the quantity of the plurality of second beam signals is based at least in part on a processing capability of a beamformer and respective bit-widths of the first plurality of samples and the second plurality of samples.

11. The method of claim 9, wherein:

generating the plurality of first beam signals comprises inputting a first portion of the first plurality of samples to a first portion of an adder of a beamformer and a second portion of the first plurality of samples to a second portion of the adder of the beamformer, the first portion of the adder being associated with a first communication signal and the second portion of the adder being associated with a second communication signal, and generating the plurality of second beam signals comprises inputting the second plurality of samples to the first portion of the adder and the second portion of the adder, the adder being associated with the first communication signal.

12. The method of claim 1, wherein:

the first analog signal is sampled by a signal converter that comprises a first element for detecting signals within a first voltage range and a second element for detecting signals within a second voltage range that is greater than the first voltage range, the method further comprises disabling the second element based at least in part on the first analog signal being entirely within the first voltage range, wherein a first plurality of samples having a first bit-width is obtained during the first time period by the signal converter based at least in part on the second element being disabled, the first digital sequence comprising the first plurality of samples; and adapting the first sampling range to the second sampling range comprises enabling the second element based at least in part on the second analog signal being within the second voltage range, wherein a second plurality of samples having a second bit-width is obtained during the second time period by the signal converter based at least in part on the first element and the second element being enabled, the second digital sequence comprising the second plurality of samples.

13. The method of claim 1, wherein:

the first analog signal is sampled by a signal converter that comprises a first element for detecting signals within a first voltage range, a second element for detecting signals within a second voltage range that is greater than the first voltage range, and a third element for detecting signals within a third voltage range that is greater than the second voltage range, the method further comprises disabling the second element and the third element based at least in part on the first analog signal being within the first voltage range, wherein a first plurality of samples having a first bit-width is obtained during the first time period by the signal converter while the second element and the third element are disabled, the first digital sequence comprising the first plurality of samples; and adapting the first sampling range to the second sampling range comprises enabling the second element and the third element based at least in part on the second analog signal being within the third voltage range, wherein a second plurality of samples having a second bit-width is obtained during the second time period by the signal converter based at least in part on the second element being enabled, the second digital sequence comprising the second plurality of samples.

14. The method of claim 1, wherein the first analog signal and the second analog signal are sampled by a signal converter that comprises a first element for sampling signals within a first voltage range and a second element for sampling signals within a second voltage range that is greater than the first voltage range, and wherein the method further comprises:

determining that interference in an area is below an interference threshold; and adapting the second sampling range to the first sampling range based at least in part on the interference being below the interference threshold, wherein adapting the second sampling range to the first sampling range comprises disabling the second element.

15. The method of claim 1, wherein the first analog signal and the second analog signal are sampled by a signal converter that comprises a first element for sampling signals within a first voltage range and a second element for sampling signals within a second voltage range that is greater than the first voltage range, and wherein the method further comprises:

determining that interference is above an interference threshold in an area, wherein adapting the first sampling range to the second sampling range comprises enabling the second element based at least in part on the interference being above the interference threshold.

16. The method of claim 15, wherein the first element comprises a first set of comparators and the second element comprises a second set of comparators.

17. The method of claim 1, wherein the first analog signal and the second analog signal are sampled by a signal converter that comprises a successive approximation circuit, and wherein the method further comprises:

determining that interference in an area is above an interference threshold, wherein adapting the first sampling range to the second sampling range comprises increasing a quantity of approximation cycles applied by the successive approximation circuit to an analog sample based at least in part on the interference being above the interference threshold.

18. The method of claim 1, wherein the first analog signal comprises a first portion of an analog signal and the second analog signal comprises a second portion of the analog signal.

19. An apparatus for communications, comprising:

an antenna configured to output a first analog signal and a second analog signal; and a signal converter coupled with the antenna and configured to:

convert the first analog signal to a first digital sequence in accordance with a first sampling range and a sampling resolution step size, wherein the first sampling range of the signal converter is adaptable to a second sampling range while the sampling resolution step size of the signal converter over the second sampling range changes no more than 10% from the sampling resolution step size over the first sampling range, and wherein the signal converter is further configured to adapt the first sampling range to the second sampling range for the second analog signal based at least in part on a metric of interference; and output the first digital sequence based at least in part on converting the first analog signal and a second digital sequence based at least in part on converting the second analog signal.

20. The apparatus of claim 19, wherein the signal converter is further configured to:

output a first plurality of samples taken of the first analog signal during a first time period, each sample of the first plurality of samples having a first bit-width based at least in part on the first sampling range of the signal converter having a first width; and output, a second plurality of samples taken of the second analog signal during a second time period, each sample of the second plurality of samples having a second bit-width based at least in part on the second sampling range of the signal converter having a second width, the first bit-width being less than the second bit-width.

21. The apparatus of claim 20, further comprising:

an interface configured to communicate information at a data rate, wherein the signal converter is further configured to adapt a sampling frequency based at least in part on the data rate supported by the interface and a difference between the first bit-width and the second bit-width.

22. The apparatus of claim 20, further comprising:

a beamformer configured to generate a first plurality of beam signals based at least in part on the first digital sequence and to generate a second plurality of beam signals based at least in part on the second digital sequence, wherein a first quantity of the first plurality of beam signals is different than a second quantity of the second plurality of beam signals, and wherein the beamformer is further configured to adapt the first plurality of beam signals to the second plurality of beam signals based at least in part on a processing capability of the beamformer and a difference between the first bit-width and the second bit-width.

23. The apparatus of claim 22, wherein the beamformer further comprises an adder configured to:

receive, during the first time period, a first portion of the first plurality of samples using a first portion of the adder and a second portion of the first plurality of samples using a second portion of the adder, wherein the first portion of the adder is associated with a first communication signal and the second portion of the adder is associated with a second communication signal; and receive, during the second time period, the second plurality of samples using the first portion of the adder and the second portion of the adder, wherein the adder is associated with the first communication signal.

24. The apparatus of claim 19, wherein the signal converter comprises:

a first element configured to sample signals within a first voltage range; and a second element configured to sample signals within a second voltage range that is different than the first voltage range, wherein logic of the second element is configured to enable an operation of the second element based at least in part on the metric of interference satisfying a threshold.

25. The apparatus of claim 24, wherein the signal converter is further configured to:

sample the first analog signal to obtain a first plurality of samples when the second element is disabled, the first digital sequence comprising the first plurality of samples; and sample the second analog signal to obtain a second plurality of samples when the second element is enabled, the second digital sequence comprising the second plurality of samples, wherein the first plurality of samples has a first bit-width and the second plurality of samples has a second bit-width.

26. The apparatus of claim 24, wherein the signal converter comprises:

a third element configured to sample signals within a third voltage range that is different than the second voltage range, wherein logic of the third element is configured to enable an operation of the third element based at least in part on the metric of interference satisfying a second threshold that is greater than the threshold.

27. The apparatus of claim 24, wherein the signal converter is an analog-to-digital converter.

28. The apparatus of claim 19, wherein the signal converter comprises:

a plurality of comparators configured to receive the first analog signal and the second analog signal and to compare respective versions of the first analog signal with respective reference signals; and a decoder coupled with the plurality of comparators and configured to output the first digital sequence and the second digital sequence based at least in part on an output of the plurality of comparators, wherein a bit-width of samples output by the decoder is based at least in part on the first sampling range of the signal converter.

29. The apparatus of claim 28, wherein, to adapt the first sampling range of the signal converter to the second sampling range, the signal converter is further configured to:

disable or enable a set of comparators of the plurality of comparators; and modify, based at least in part on disabling or enabling the set of comparators, a set of reference signals provided to the enabled comparators of the plurality of comparators.

30. The apparatus of claim 19, wherein the signal converter comprises:

a sample-and-hold circuit configured to receive the first analog signal and to output a third analog signal during a sampling period;

a successive approximation register coupled with the sample-and-hold circuit and configured to store a digital sample;

a subtractor coupled with the sample-and-hold circuit, wherein:

a first input of the subtractor is configured to receive, during the sampling period, the third analog signal, a second input of the subtractor is configured to receive, during the sampling period, a plurality of analog representations of the digital sample stored in the successive approximation register, and the subtractor is further configured to output, during the sampling period, a plurality of analog signals based at least in part on the third analog signal and the plurality of analog representations of the digital sample; and a comparator configured to output, during the sampling period and based at least in part on the plurality of analog signals, a plurality of result signals, wherein the successive approximation register is further configured to update the digital sample based at least in part on the plurality of result signals, wherein a bit-width of the digital sample is based on a quantity of result signals of the plurality of result signals.

31. The apparatus of claim 30, wherein, to adapt the first sampling range of the signal converter to the second sampling range, the signal converter is further configured to:

adapt the quantity of result signals output by the comparator during respective sampling periods.

* * * * *